US010678962B2

(12) United States Patent
Vanker et al.

(10) Patent No.: US 10,678,962 B2
(45) Date of Patent: *Jun. 9, 2020

(54) INTEGRATED CONSTRUCTION PORTAL

(71) Applicant: PatCO, LLC, Arvada, CO (US)

(72) Inventors: John Louis Vanker, Lac du Flambeau, WI (US); Michael J. Lastowski, Centennial, CO (US)

(73) Assignee: PATCO LLC, Arvada, CO (US)

( * ) Notice: Subject to any disclaimer, the term of this patent is extended or adjusted under 35 U.S.C. 154(b) by 806 days.

This patent is subject to a terminal disclaimer.

(21) Appl. No.: 15/244,722

(22) Filed: Aug. 23, 2016

(65) Prior Publication Data

US 2017/0098015 A1 Apr. 6, 2017

Related U.S. Application Data

(63) Continuation of application No. 14/685,440, filed on Apr. 13, 2015, now Pat. No. 9,424,374, which is a
(Continued)

(51) Int. Cl.
*G06G 7/48* (2006.01)
*G06F 30/13* (2020.01)
(Continued)

(52) U.S. Cl.
CPC ............... *G06F 30/13* (2020.01); *E04B 1/08* (2013.01); *E04B 1/19* (2013.01); *E04B 1/2403* (2013.01); *E04B 1/24* (2013.01); *E04B 2001/0053* (2013.01); *E04B 2001/246* (2013.01); *E04B 2001/2415* (2013.01); *E04B 2001/2448* (2013.01); *E04B 2001/2454* (2013.01);
(Continued)

(58) Field of Classification Search
None
See application file for complete search history.

(56) References Cited

U.S. PATENT DOCUMENTS 5,265,395 A * 11/1993 Lalvani .................. B44C 3/123
403/176
6,178,407 B1 * 1/2001 Lotvin .................. G06Q 30/02
705/14.73
(Continued)

FOREIGN PATENT DOCUMENTS

CN 102165450 8/2011

*Primary Examiner* — Rehana Perveen
*Assistant Examiner* — Nithya J. Moll
(74) *Attorney, Agent, or Firm* — Holzer Patel Drennan

(57) ABSTRACT

Method and system disclosed herein provides generating a three-dimensional construction grid based on a data file generated by an architectural software, wherein the three-dimensional grid includes three-dimensional position information of various structural building components; displaying the three-dimensional construction grid using a display device of a computing device; receiving information of various non-structural building components, the information including location of the non-structural building components on the three-dimensional grid; associating the non-structural building components to one or more of the structural components of the three-dimensional grid; and automatically generating a plurality of specifications for the non-structural building components.

8 Claims, 33 Drawing Sheets

Related U.S. Application Data continuation of application No. 13/838,723, filed on Mar. 15, 2013, now Pat. No. 9,009,011, which is a continuation-in-part of application No. 13/719,561, filed on Dec. 19, 2012, now Pat. No. 8,688,411, which is a continuation-in-part of application No. 12/964,380, filed on Dec. 9, 2010, now Pat. No. 8,528,294.

(60) Provisional application No. 61/288,011, filed on Dec. 18, 2009.

(51) Int. Cl.
*E04B 1/08* (2006.01)
*E04B 1/19* (2006.01)
*E04B 1/24* (2006.01)
*E04B 1/00* (2006.01)

(52) U.S. Cl.
CPC .............. *E04B 2001/2466* (2013.01); *E04B 2001/2481* (2013.01); *E04B 2001/2496* (2013.01)

(56) References Cited

U.S. PATENT DOCUMENTS

| | | |
|---|---|---|
| 6,859,768 B1 | 2/2005 | Wakelam et al. |
| 8,886,348 B2 * | 11/2014 | Bollendorf .......... G06F 17/5004 700/97 |
| 2004/0073410 A1 | 4/2004 | Maly et al. |
| 2012/0109785 A1 | 5/2012 | Karlsson |
| 2012/0197603 A1 | 8/2012 | Klipfel, III |

* cited by examiner

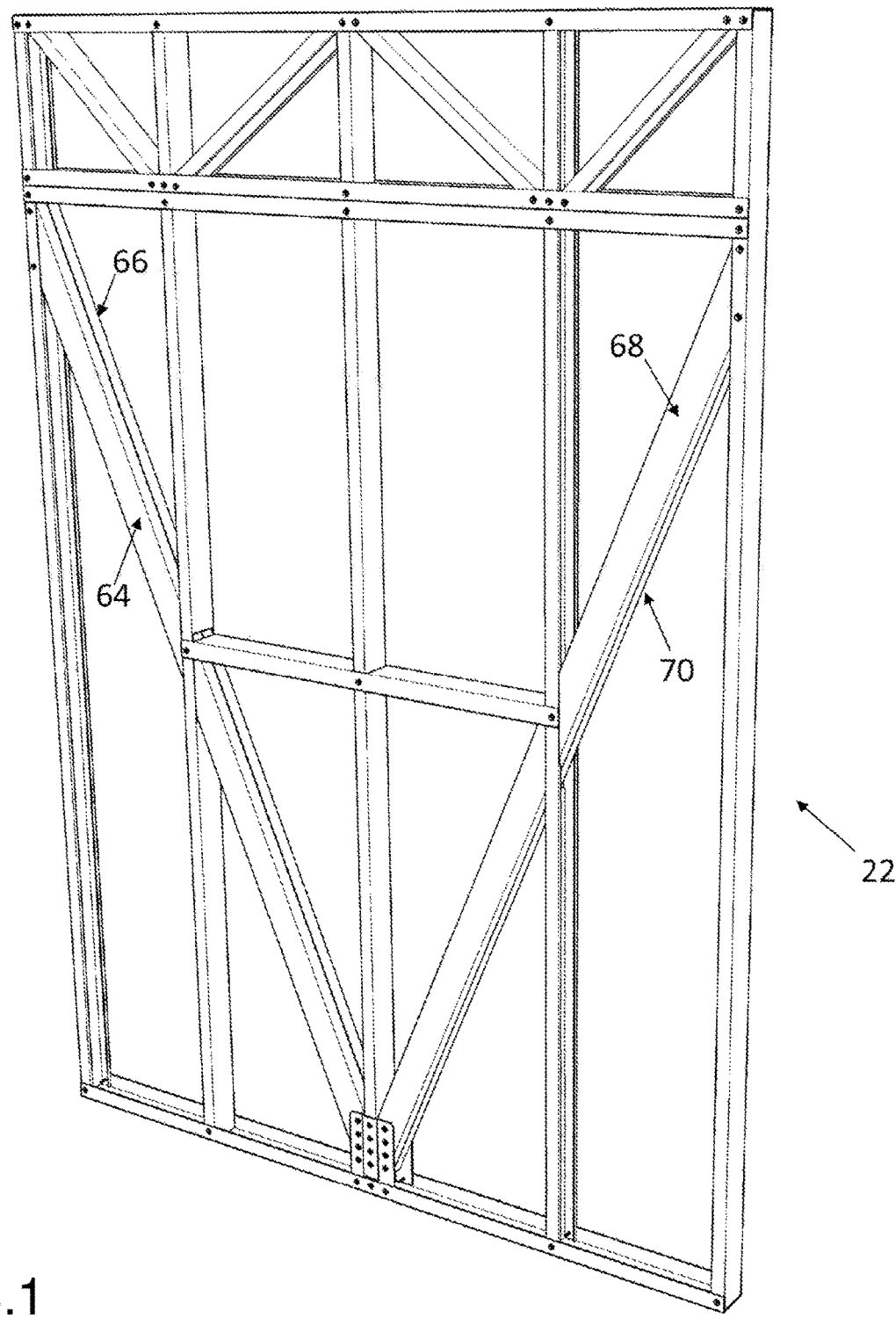
FIG. 3.1

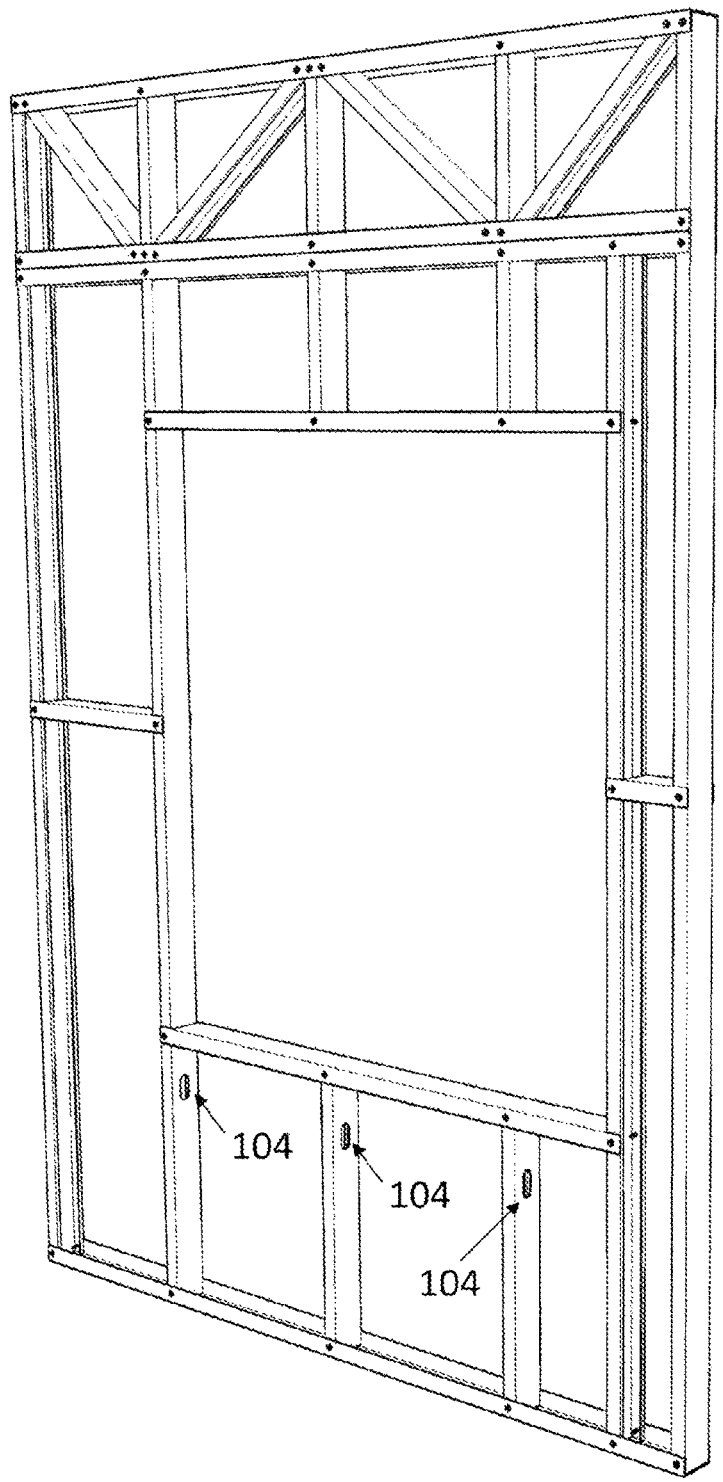
FIG. 4.1

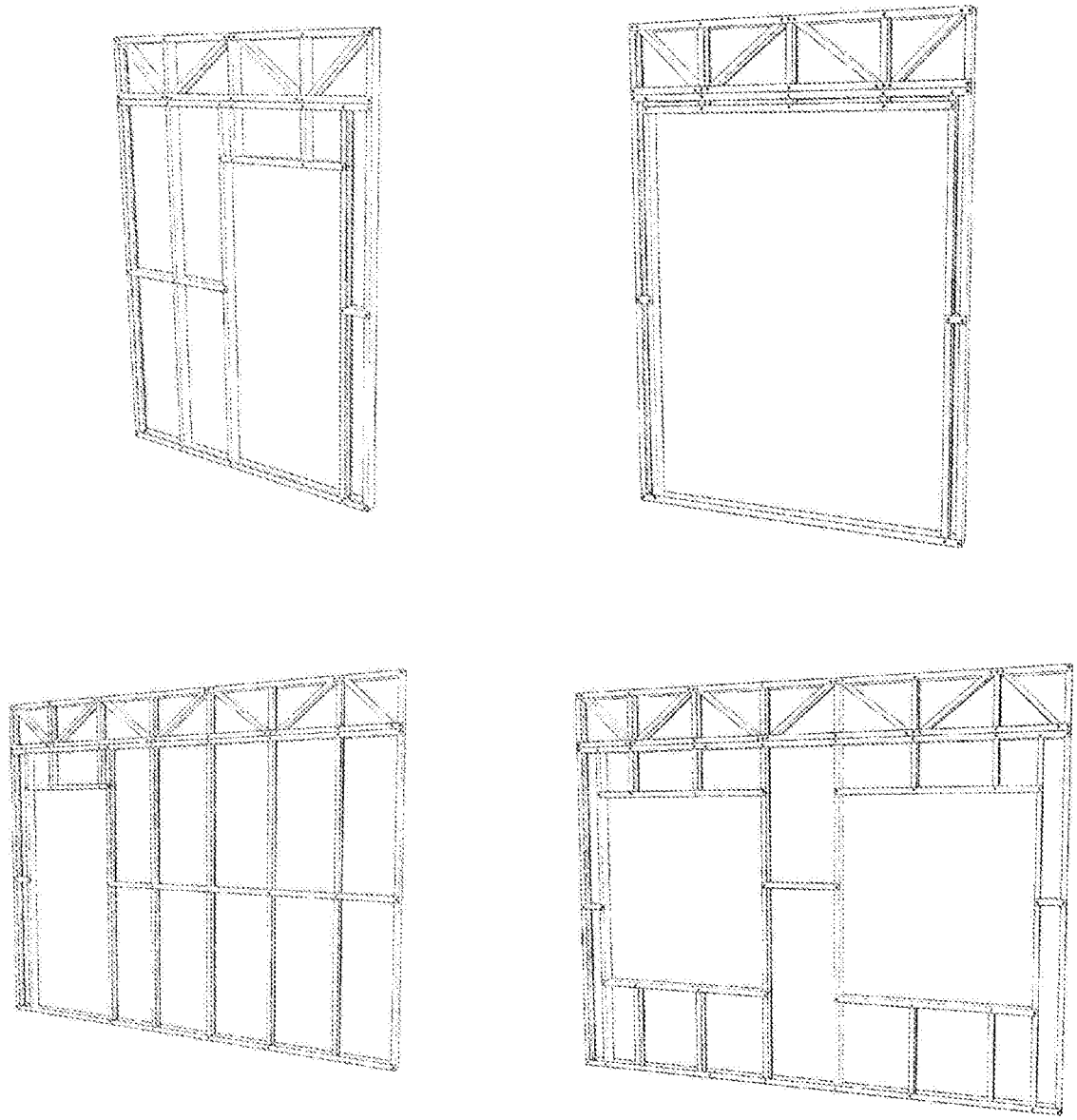
FIG. 4.2 Open Horizontal Truss Panels

INTEGRATED CONSTRUCTION PORTAL

CROSS-REFERENCE TO RELATED APPLICATIONS

The present application is a continuation of U.S. application Ser. No. 14/685,440 entitled "INTEGRATED CONSTRUCTION PORTAL" and filed on Aug. 6, 2015, (now allowed) which is a continuation of and claims benefit of priority to U.S. Non-Provisional application Ser. No. 13/838,723 entitled "INTEGRATED CONSTRUCTION PORTAL" and filed on Mar. 15, 2013, issued as U.S. Pat. No. 9,009,011, which is a continuation-in-part of and claims benefit of priority to U.S. Non-Provisional application Ser. No. 13/719,561 entitled "METHOD AND SYSTEM OF USING STANDARDIZED STRUCTURAL COMPONENTS" and filed on Dec. 19, 2012, issued as U.S. Pat. No. 8,688,411, which is a continuation-in-part of and claims benefit of U.S. Non-Provisional application Ser. No. 12/964,380 entitled "PANELIZED STRUCTURAL SYSTEM FOR BUILDING CONSTRUCTION" and filed on December 09, issued as U.S. Pat. No. 8,528,294 2010, which claims the benefit of U.S. Provisional Application Ser. No. 61/288,011 filed on Dec. 18, 2009, all of which are incorporated herein by reference in their entirety.

TECHNICAL FIELD

The present disclosure relates to a method and system for constructing and assembling buildings using panelized and modular structural system.

BACKGROUND

A building's structure must withstand physical forces or displacements without danger of collapse or without loss of serviceability or function. The stresses on buildings are withstood by the buildings' structures.

Buildings five stories and less in height typically use a "bearing wall" structural system to manage dead and live load vertical forces. Vertical forces on the roof, floors, and walls of a structure are passed vertically from the roof to the walls to the foundation by evenly spreading the loads on the walls and by increasing the size and density of the framing or frame structure from upper floors progressively downward to lower floors, floor-to-floor. For ceilings and floor spans, trusses are used to support loads on the ceilings and floors and to transfer these loads to walls and columns.

Where vertical bearing elements are absent, for example at window and door openings, beams are used to transfer loads to columns or walls. In buildings taller than five stories, where the walls have limited capacity to support vertical loads, concrete and/or structural steel framing in the form of large beams and columns are used to support the structure.

Lateral forces (e.g., wind and seismic forces) acting on buildings are managed and transferred by bracing. A common method of constructing a braced wall line in buildings (typically 5 stories or less) is to create braced panels in the wall line using structural sheathing. A more traditional method is to use let-in diagonal bracing throughout the wall line, but this method is not viable for buildings with many openings for doors, windows, etc. The lateral forces in buildings taller than five stories are managed and transferred by heavy steel let-in bracing, or heavy steel and/or concrete panels, as well as structural core elements such as concrete or masonry stair towers and elevator hoistways.

There is a need for a panelized and modular system for constructing and assembling buildings without relying on concrete and/or structural steel framing, heavy steel let-in bracing, and heavy steel and/or concrete panels.

SUMMARY

Method and system disclosed herein provides generating a three-dimensional construction grid based on a data file generated by an architectural software, wherein the three-dimensional grid includes three-dimensional position information of various structural building components; displaying the three-dimensional construction grid using a display device of a computing device; receiving information of various non-structural building components, the information including location of the non-structural building components on the three-dimensional grid; associating the non-structural building components to one or more of the structural components of the three-dimensional grid; and automatically generating a plurality of specifications for the non-structural building components.

In some implementations, articles of manufacture are provided as computer program products. One implementation of a computer program product provides a computer program storage medium readable by a computer system and encoding a computer program. Another implementation of a computer program product may be provided in a computer data signal embodied in a carrier wave by a computing system and encoding the computer program.

Other implementations are also described and recited herein.

BRIEF DESCRIPTIONS OF THE DRAWINGS

Figure 3:
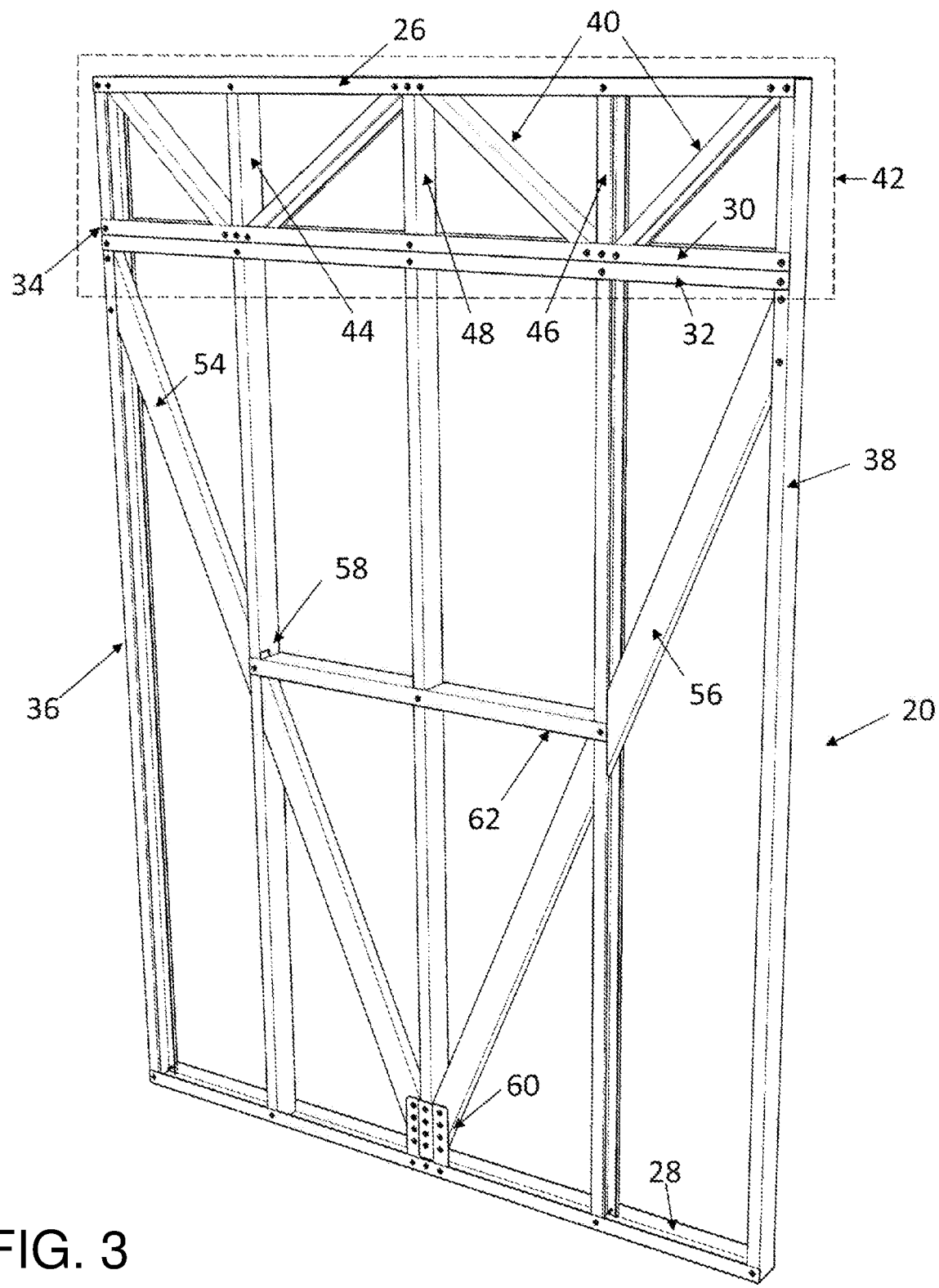
Figure 4:
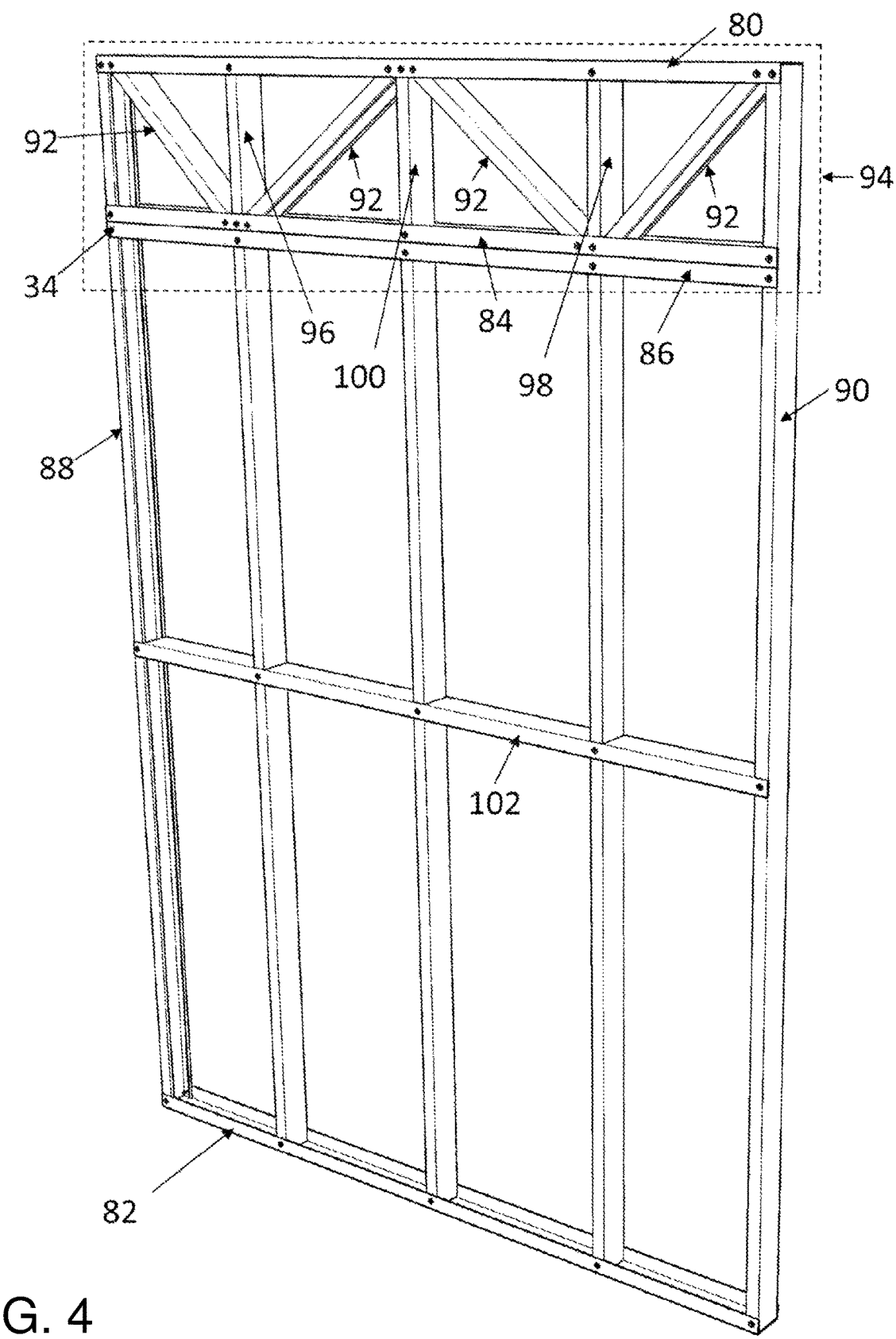
Figure 5:
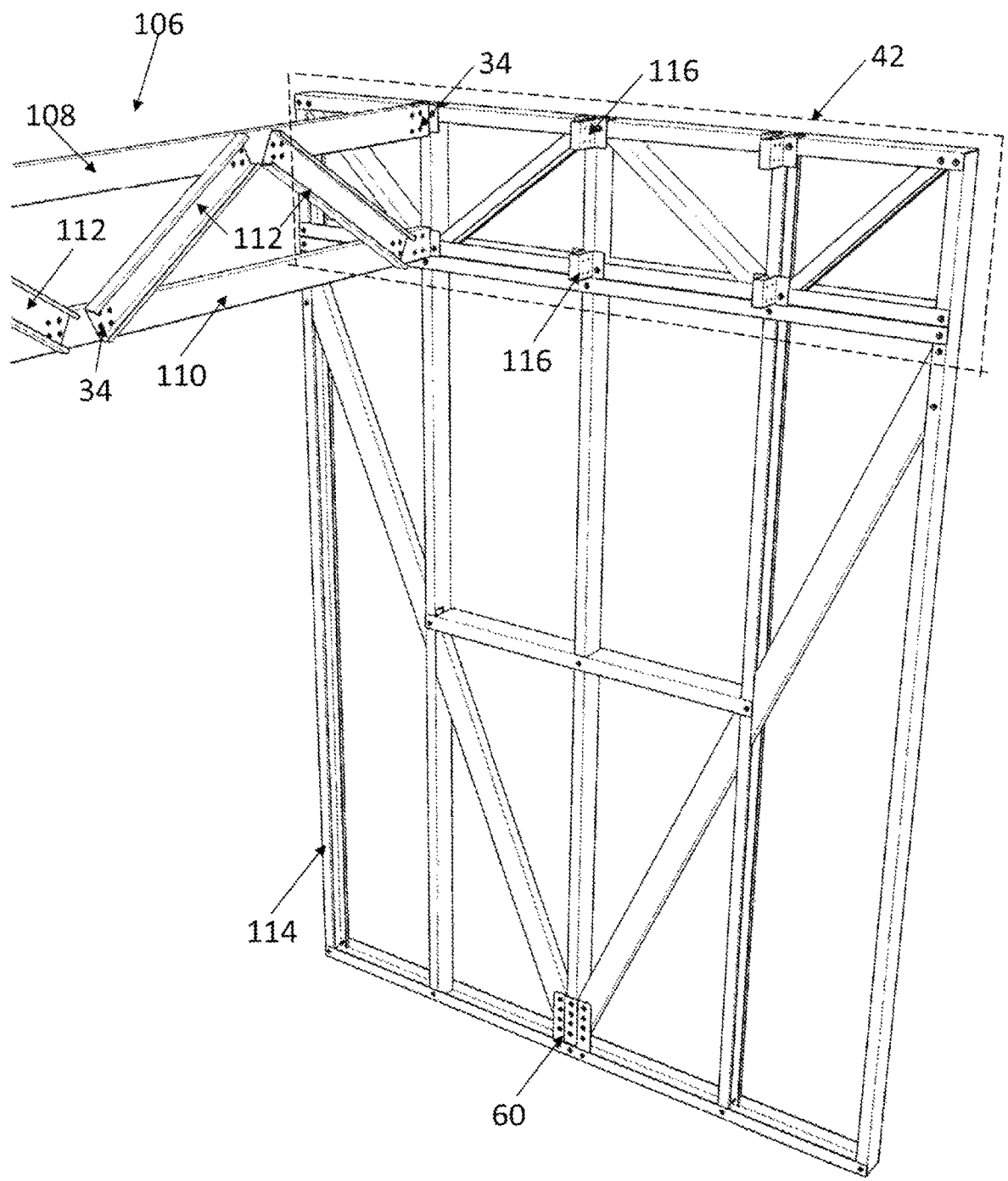
Figure 6:
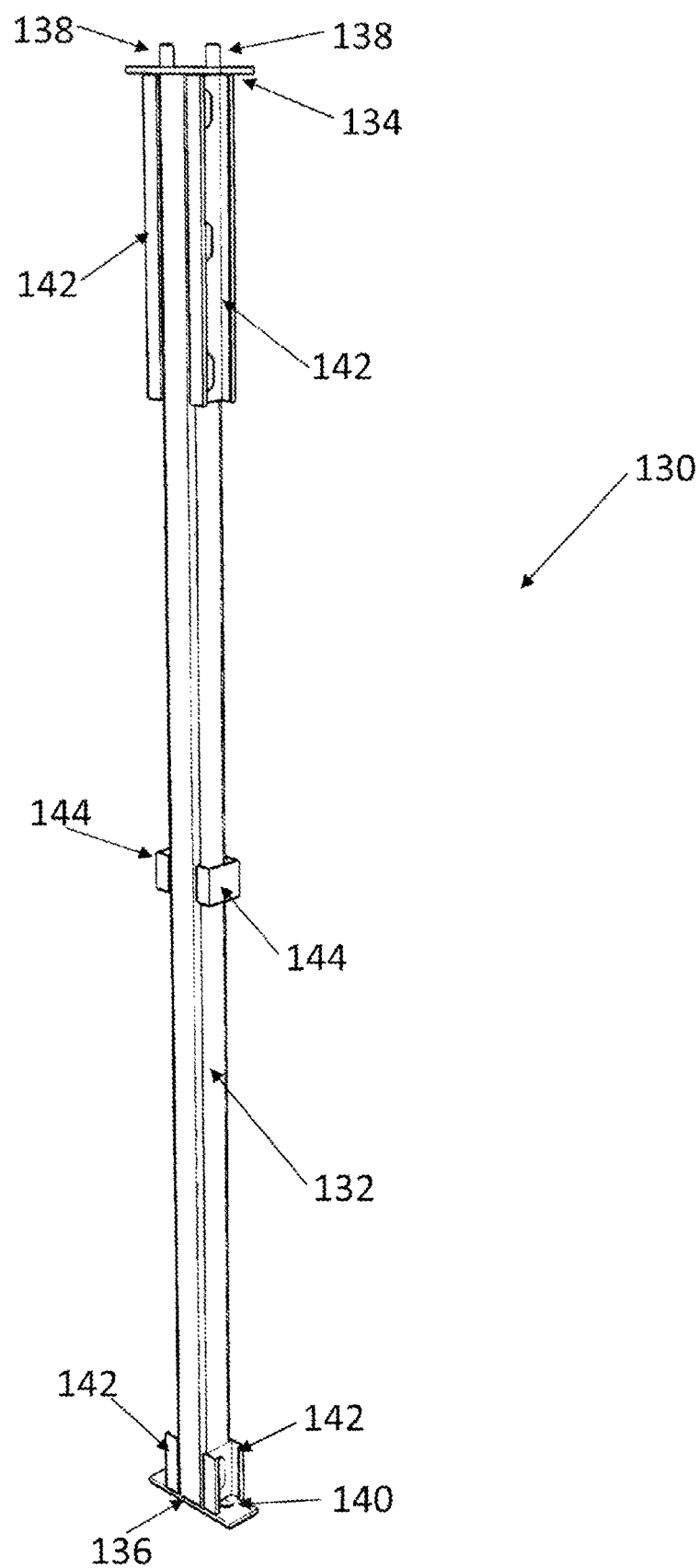
Figure 7:
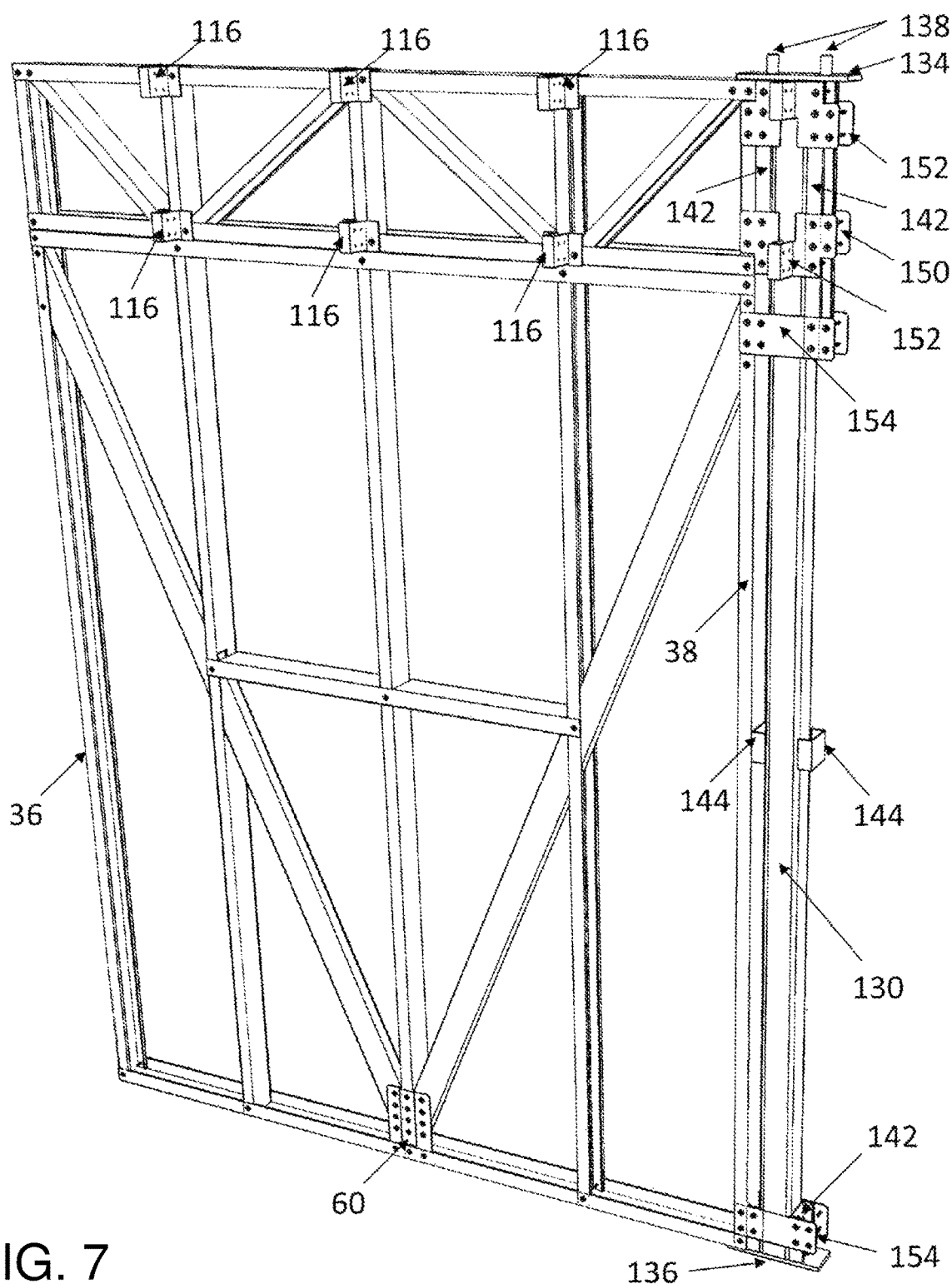
Figure 8:
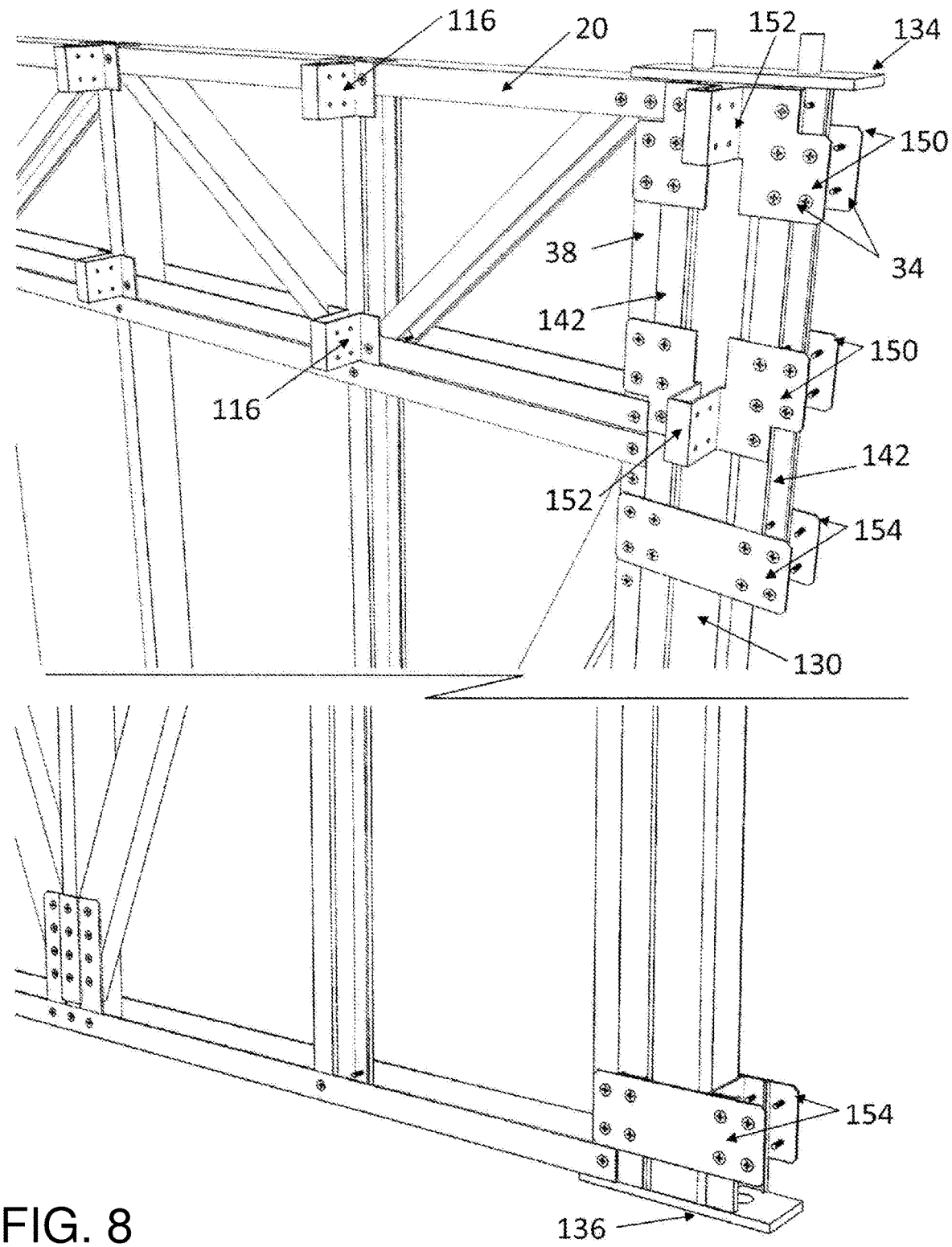
Figure 9:
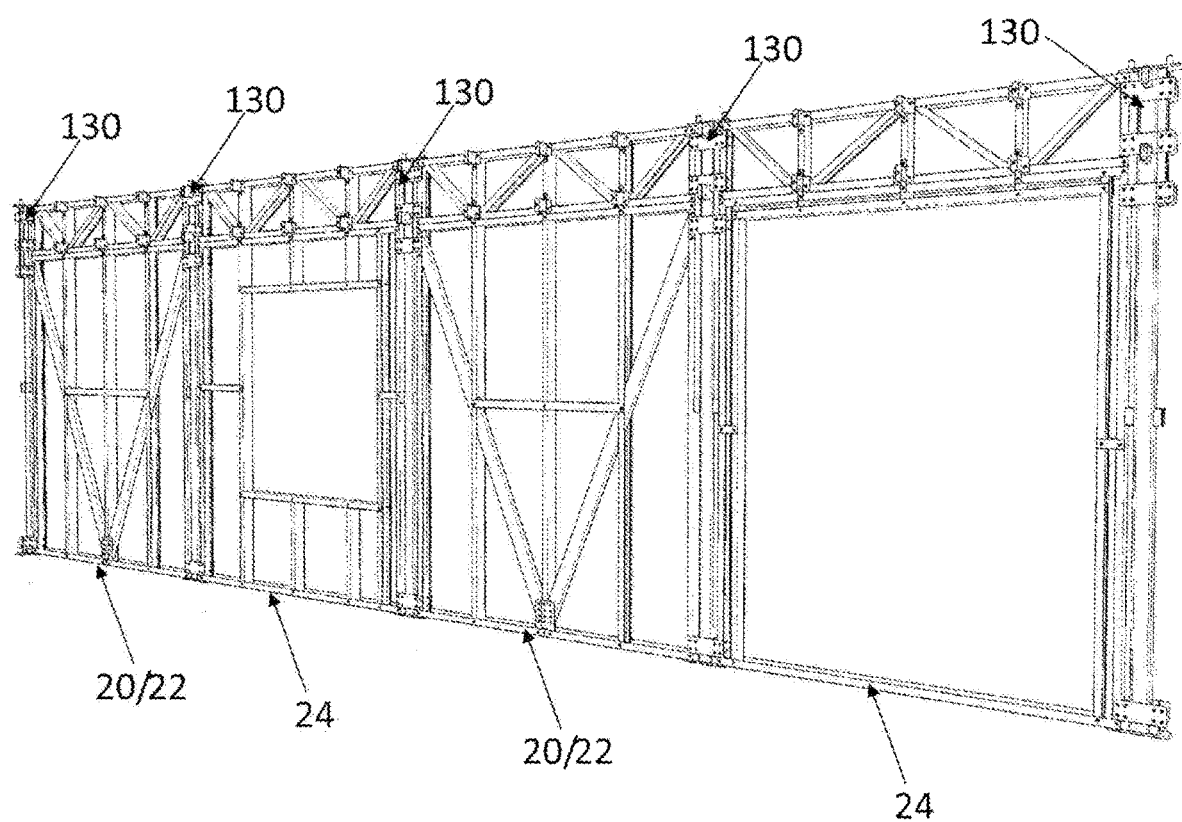
Figure 10:
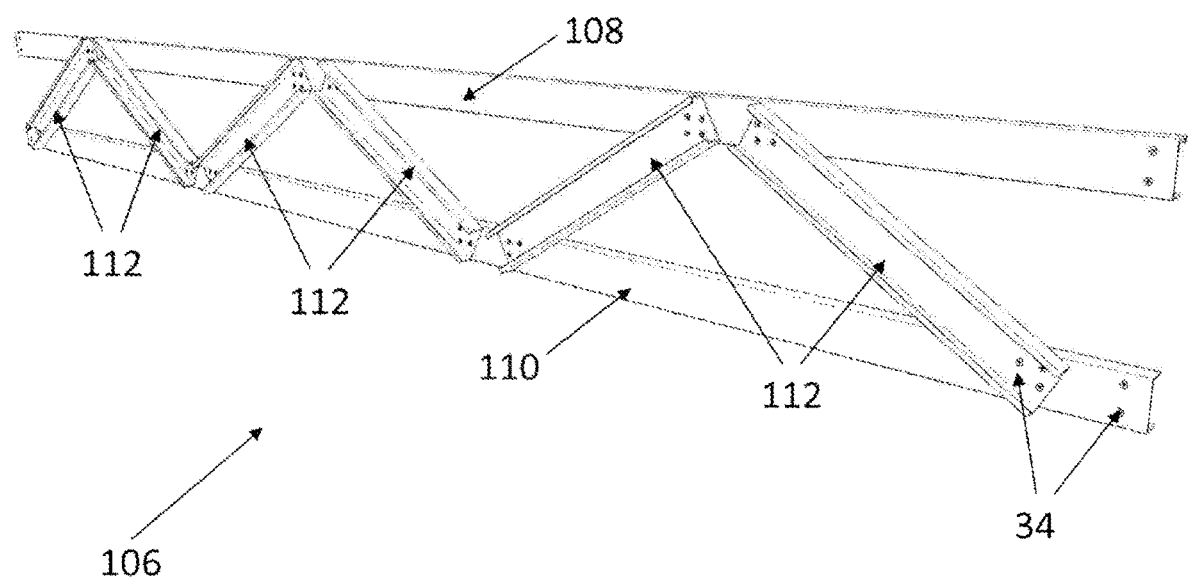
Figure 11:
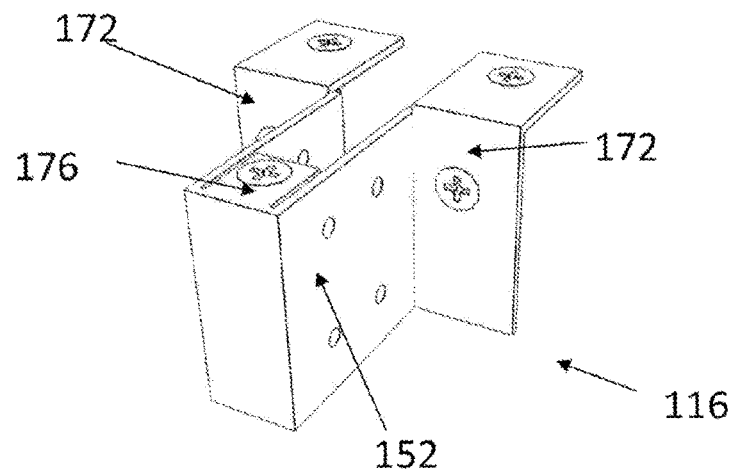
Figure 12:
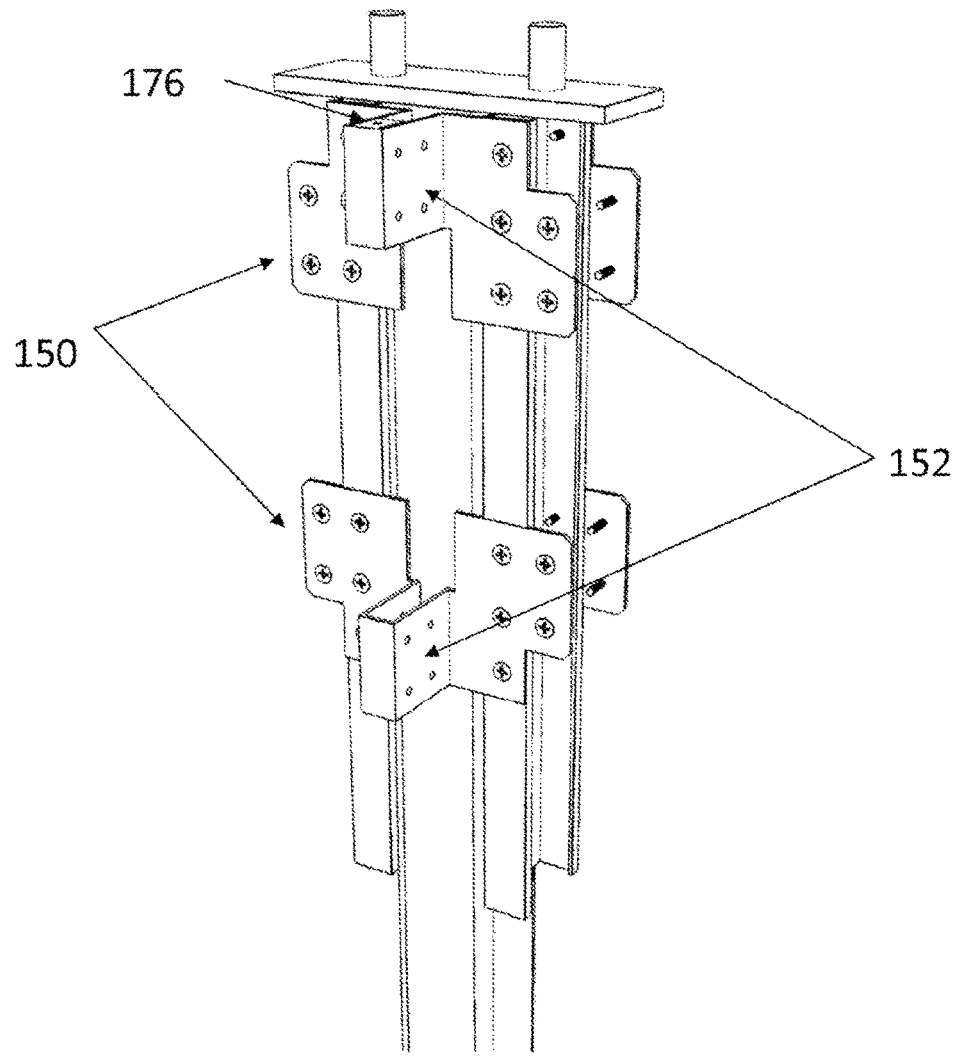
Figure 13:
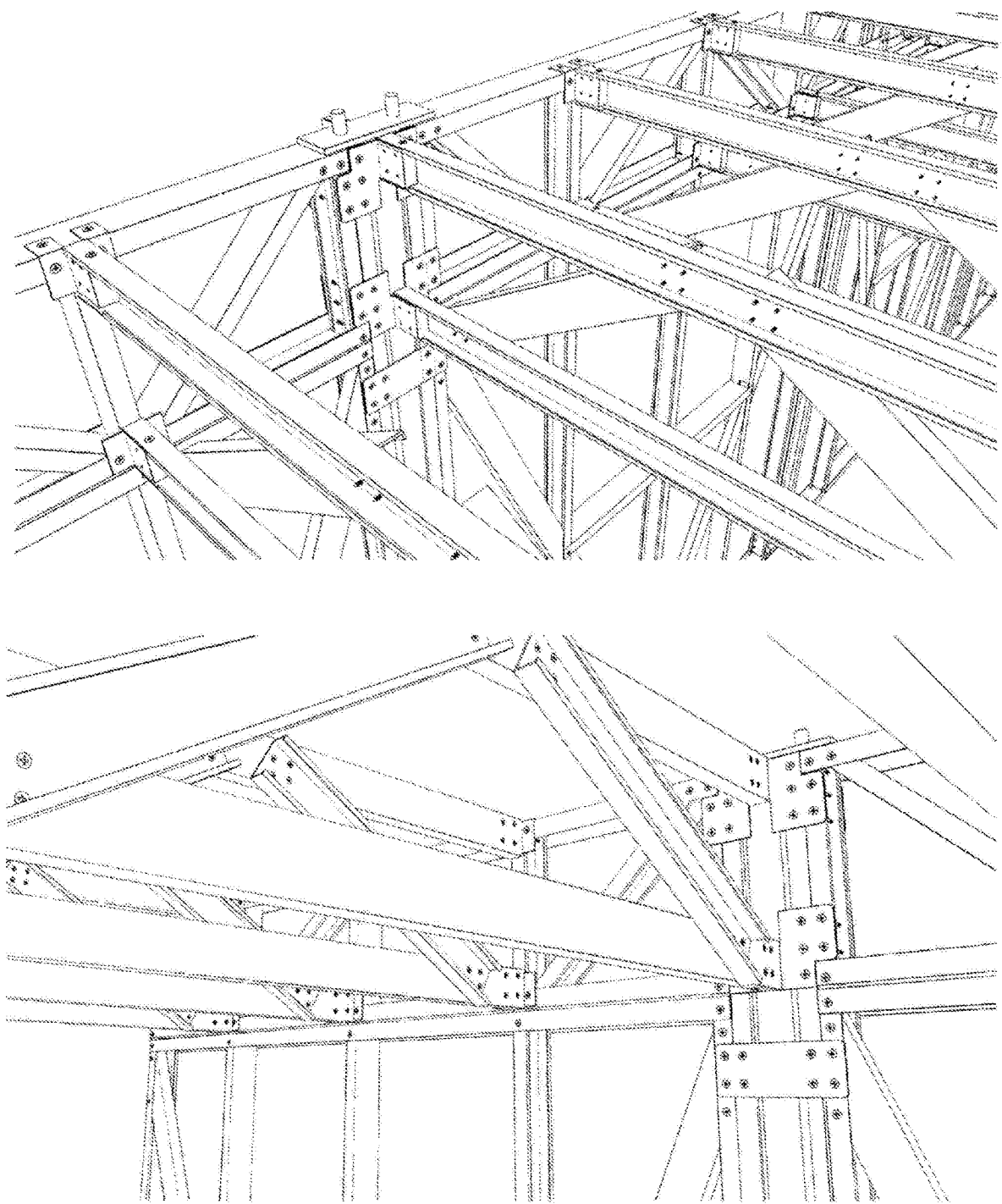
Figure 14:
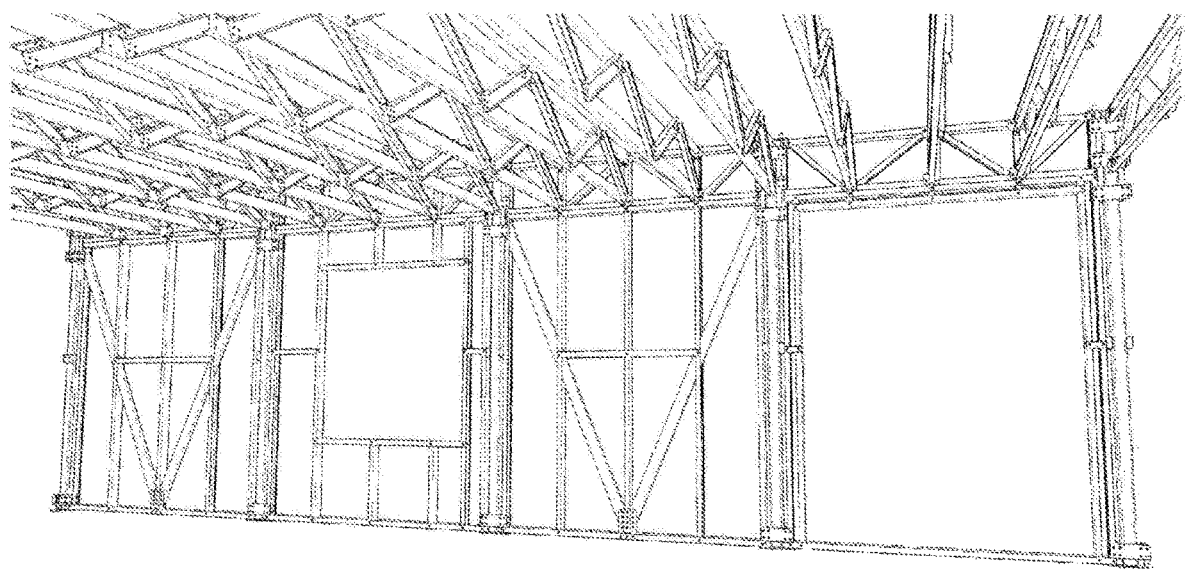
Figure 15:
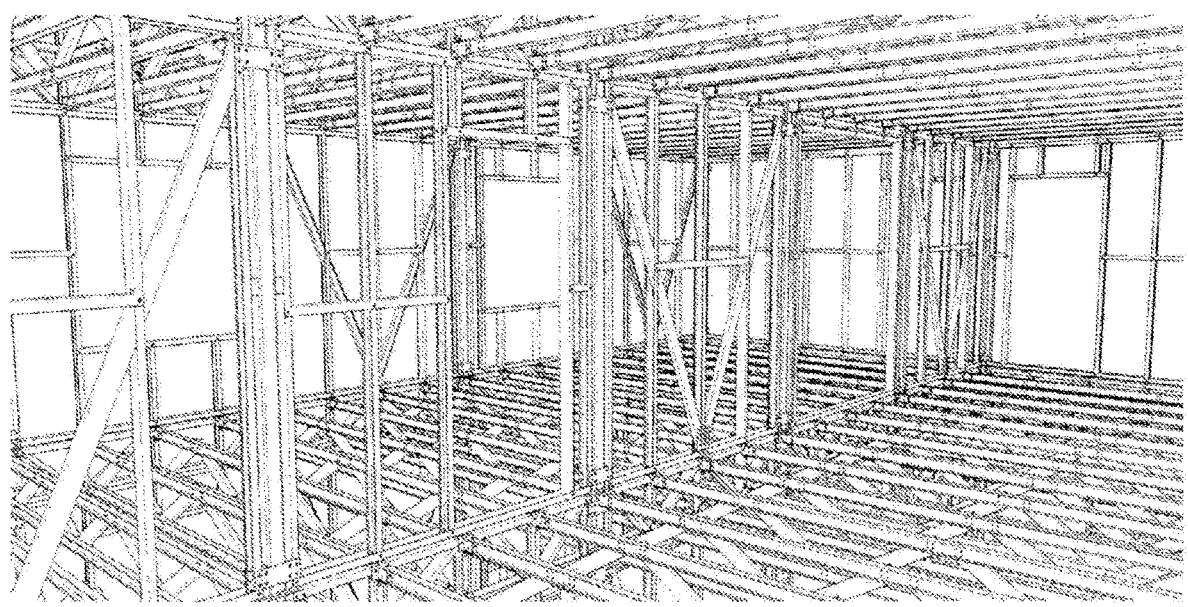
Figure 16:
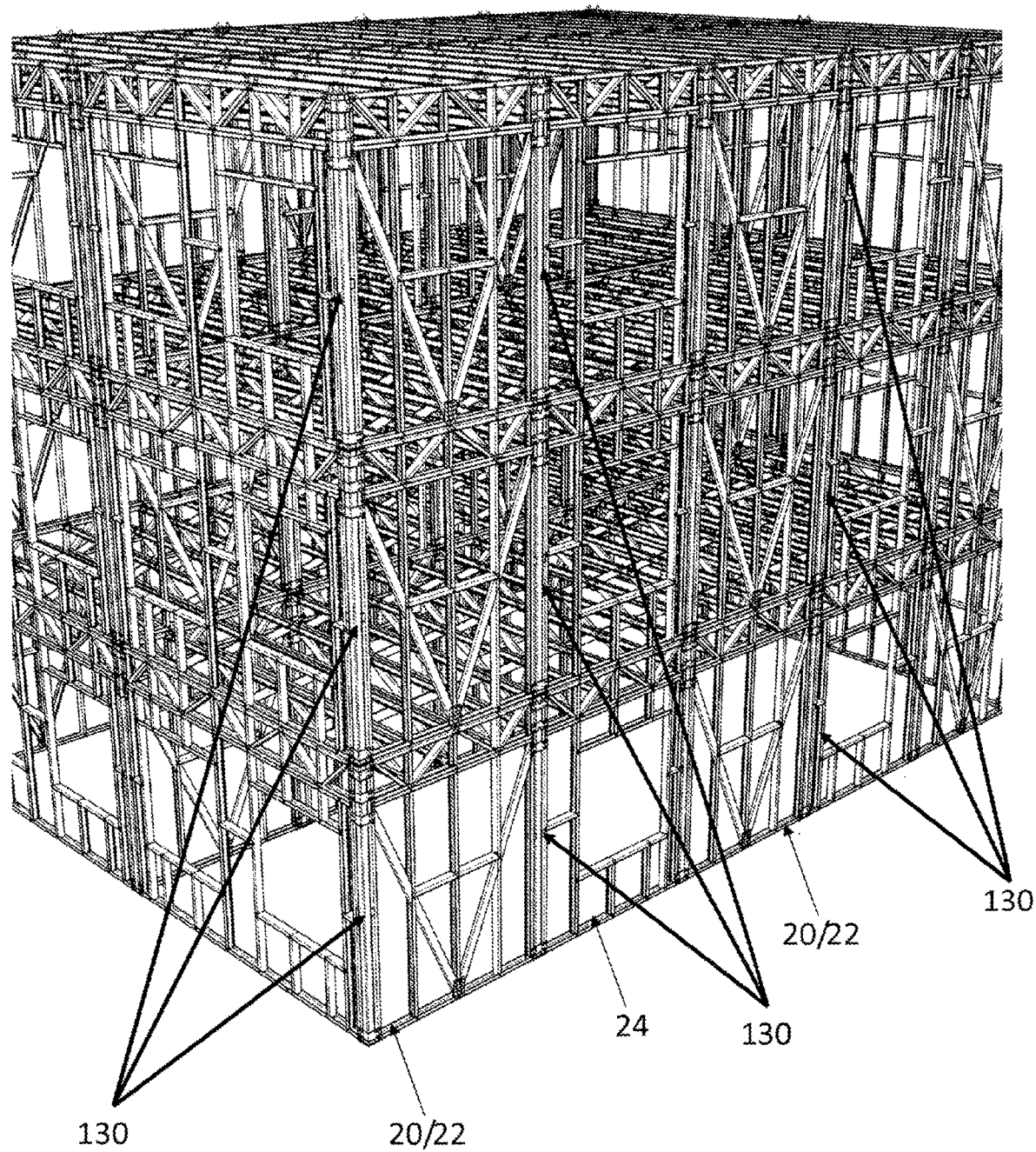
Figure 17:
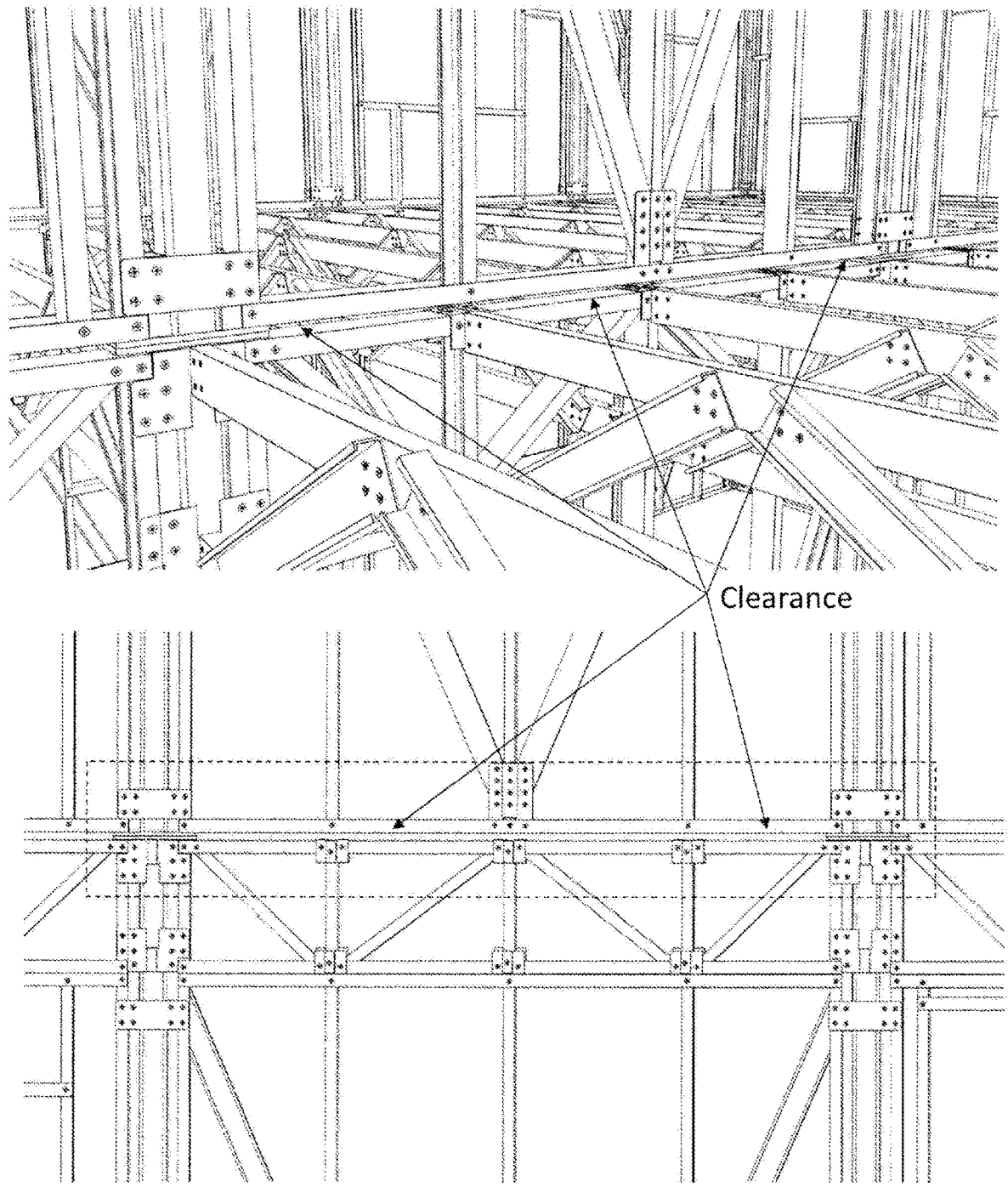
Figure 18:
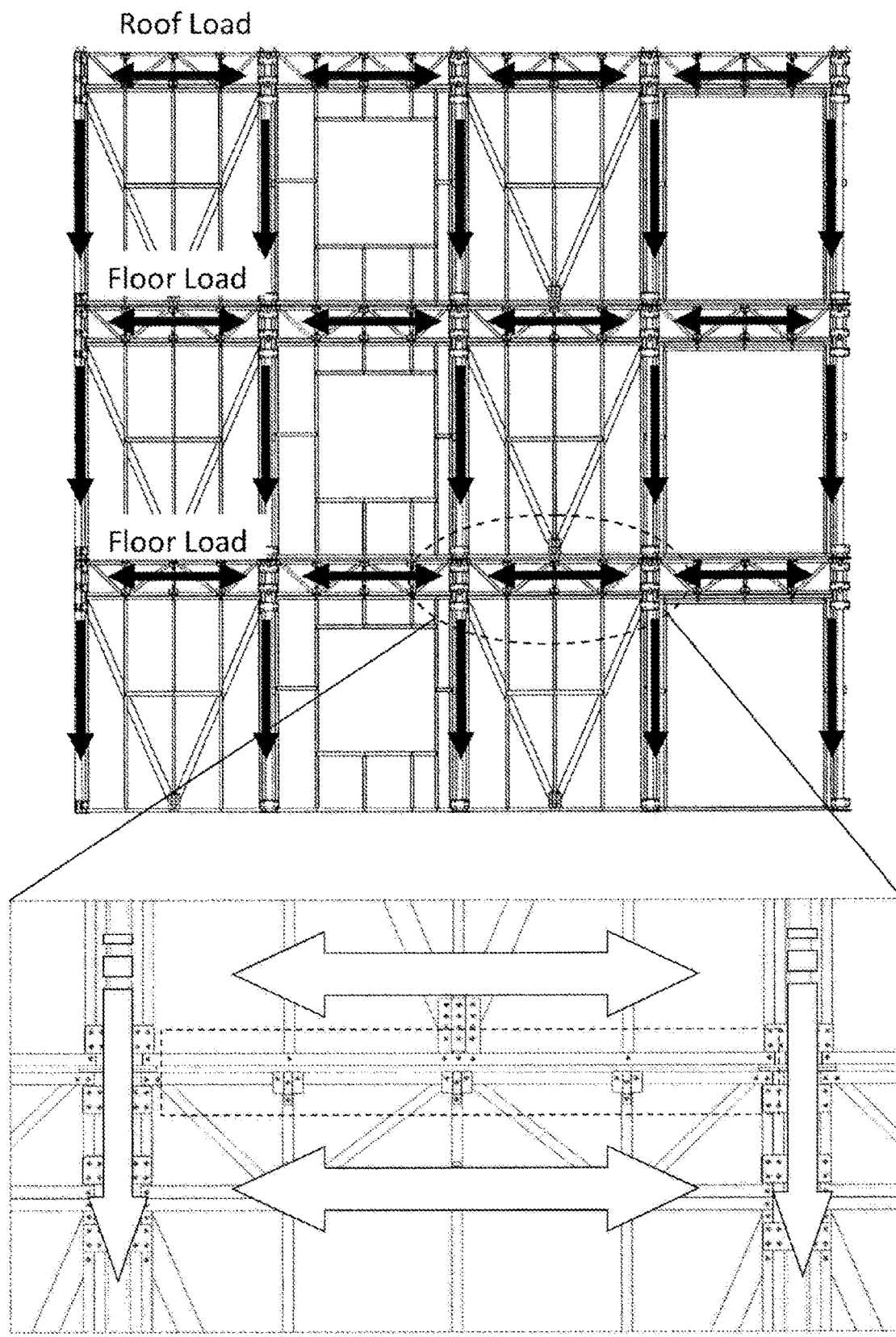
Figure 19:
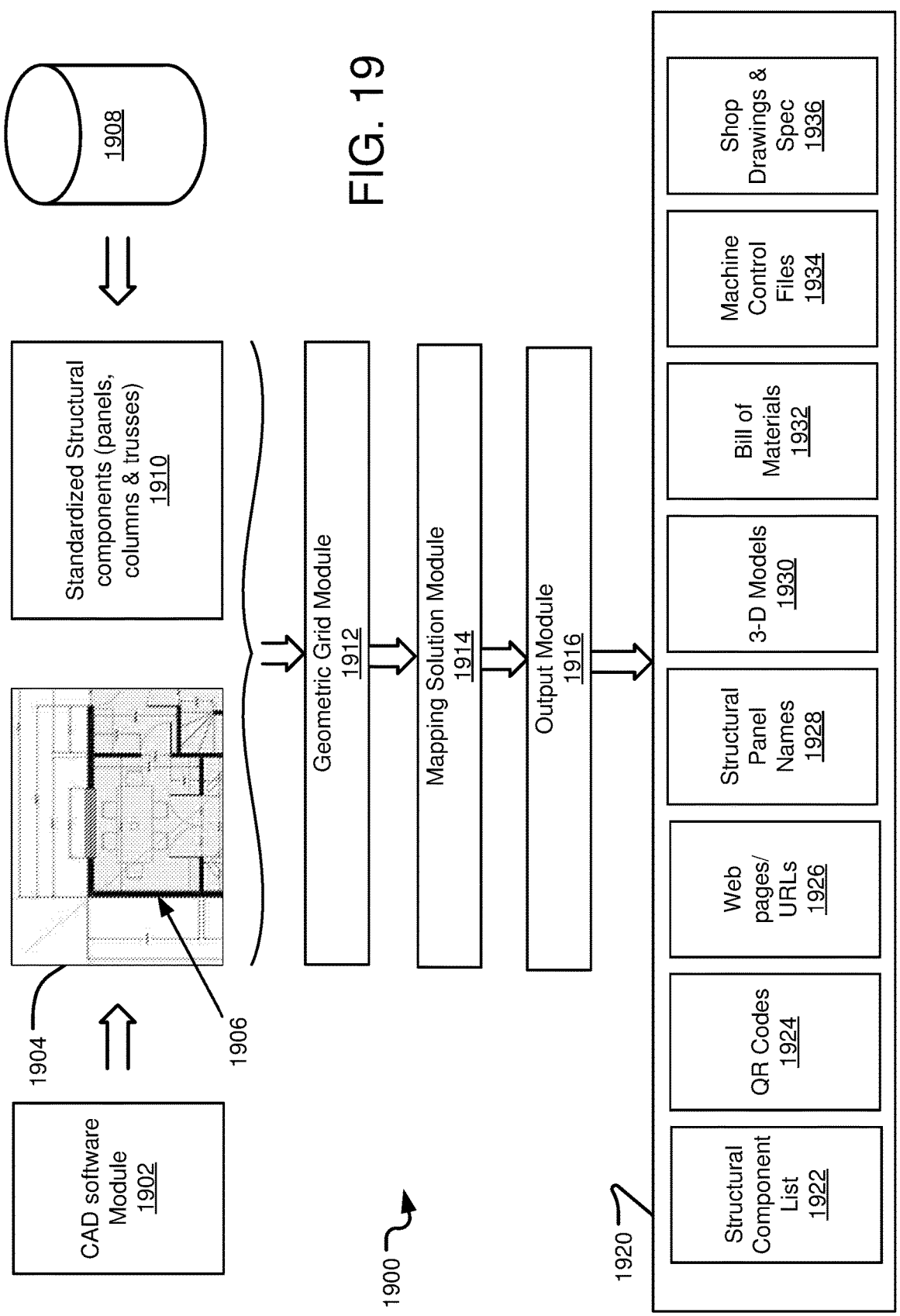
Figure 20:
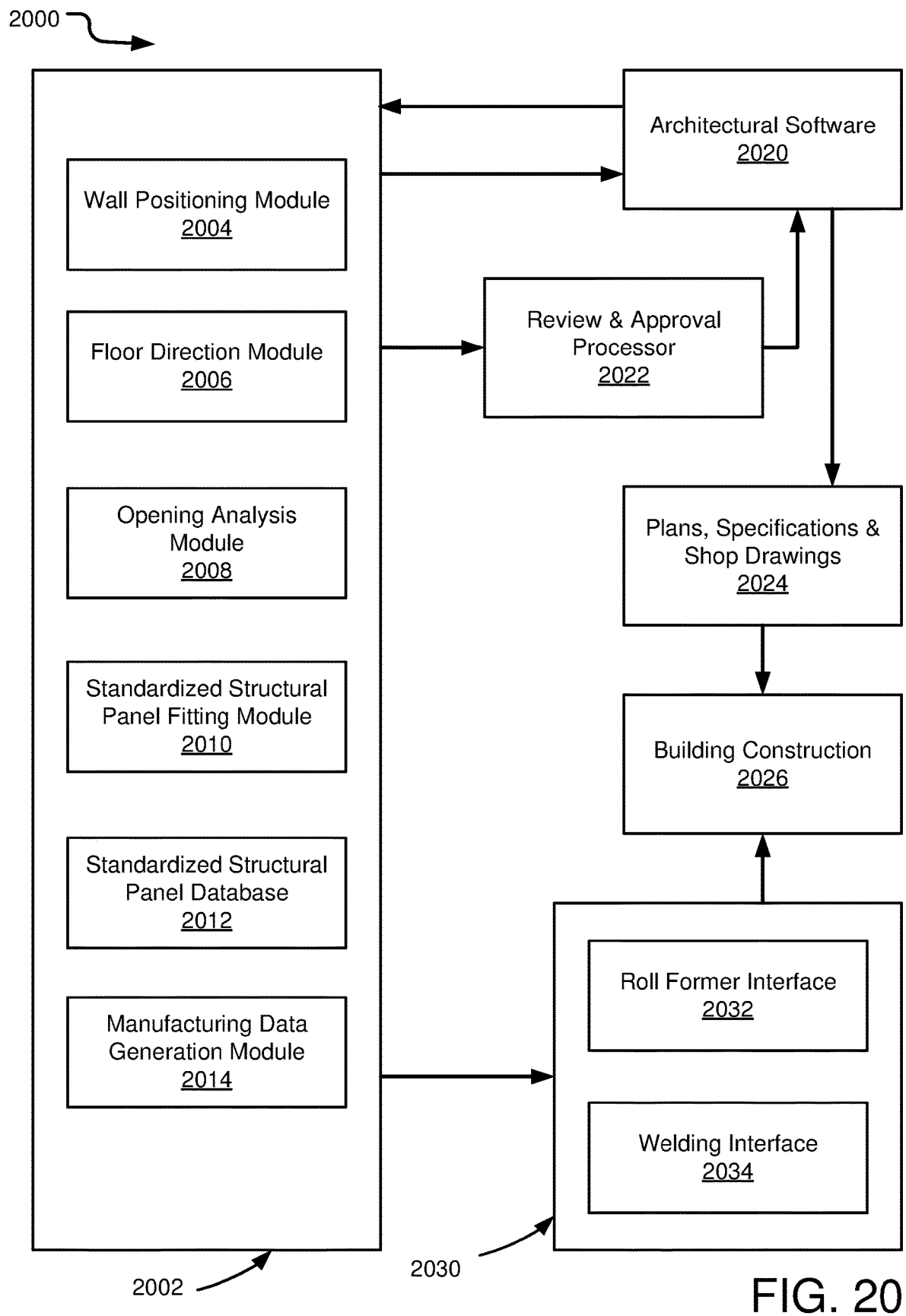
Figure 21:
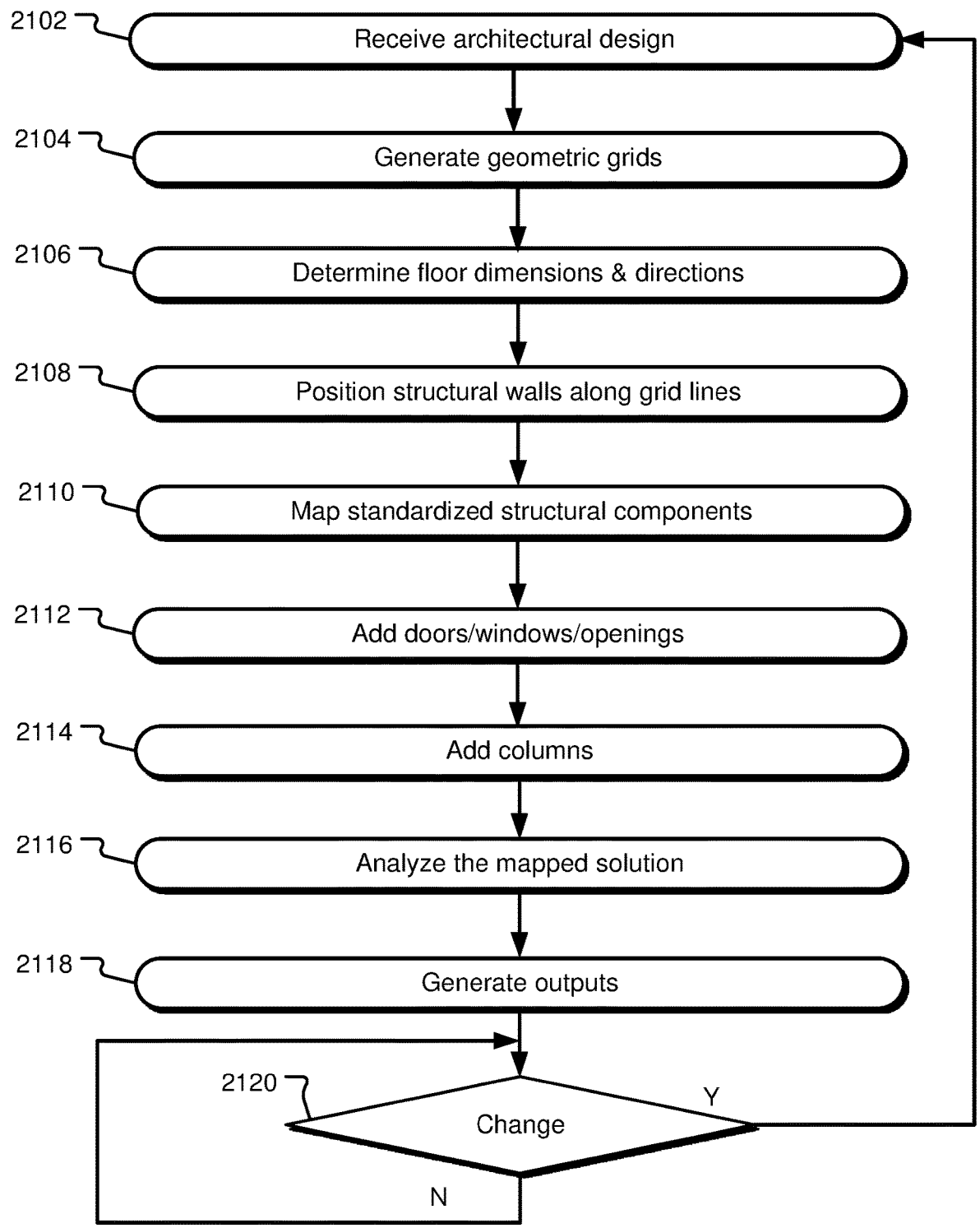
Figure 22:
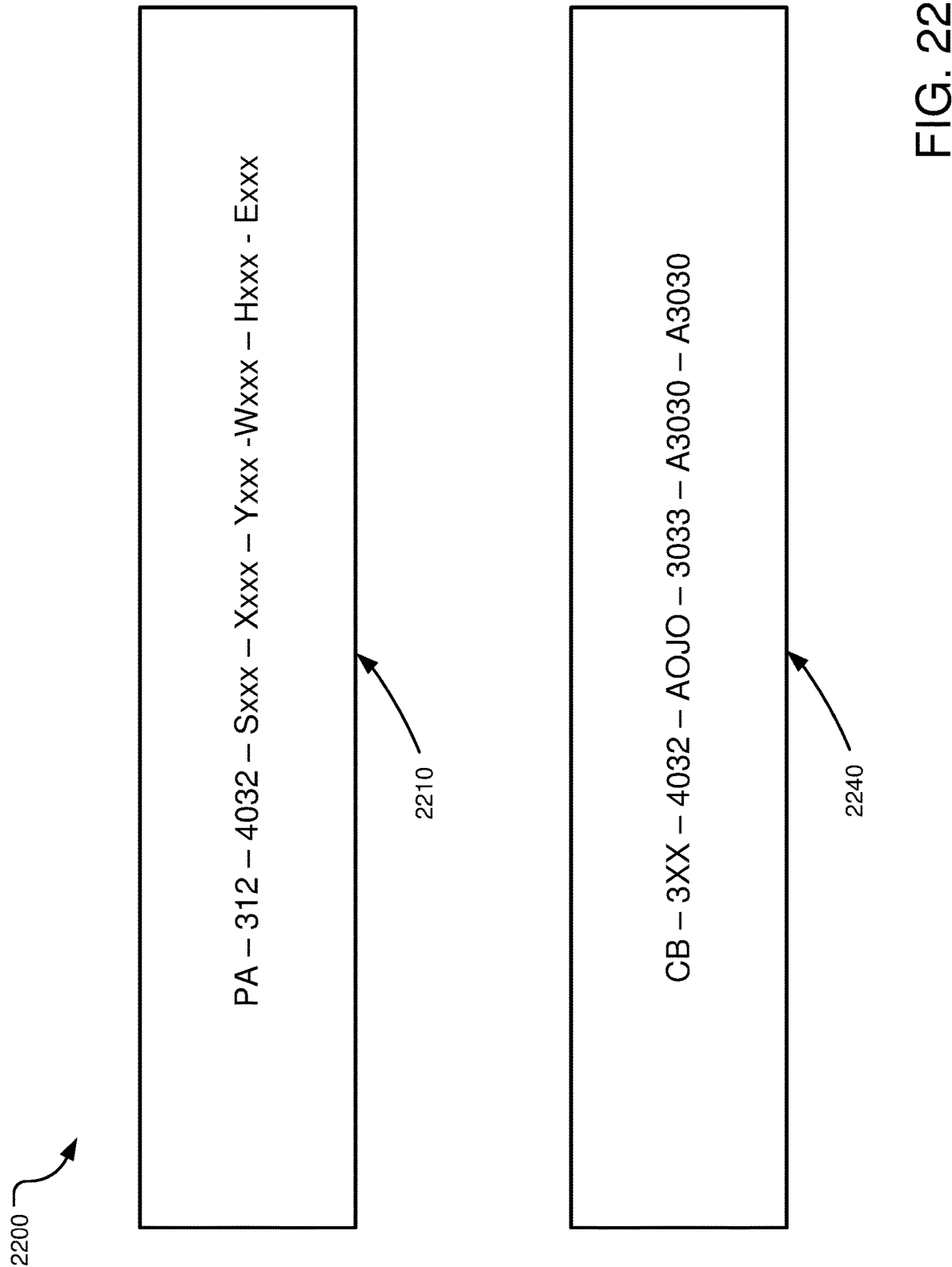
Figure 23:
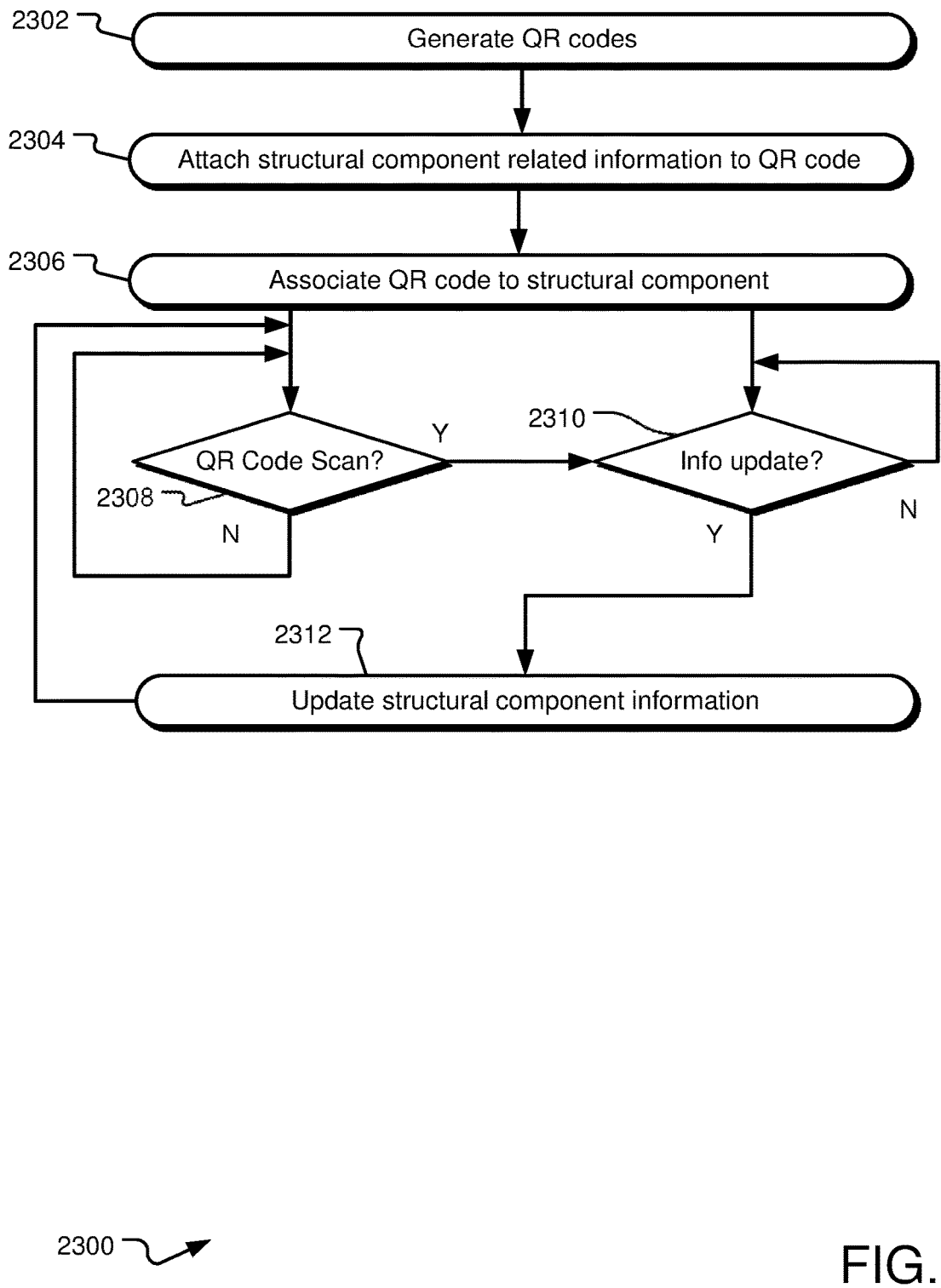
Figure 24:
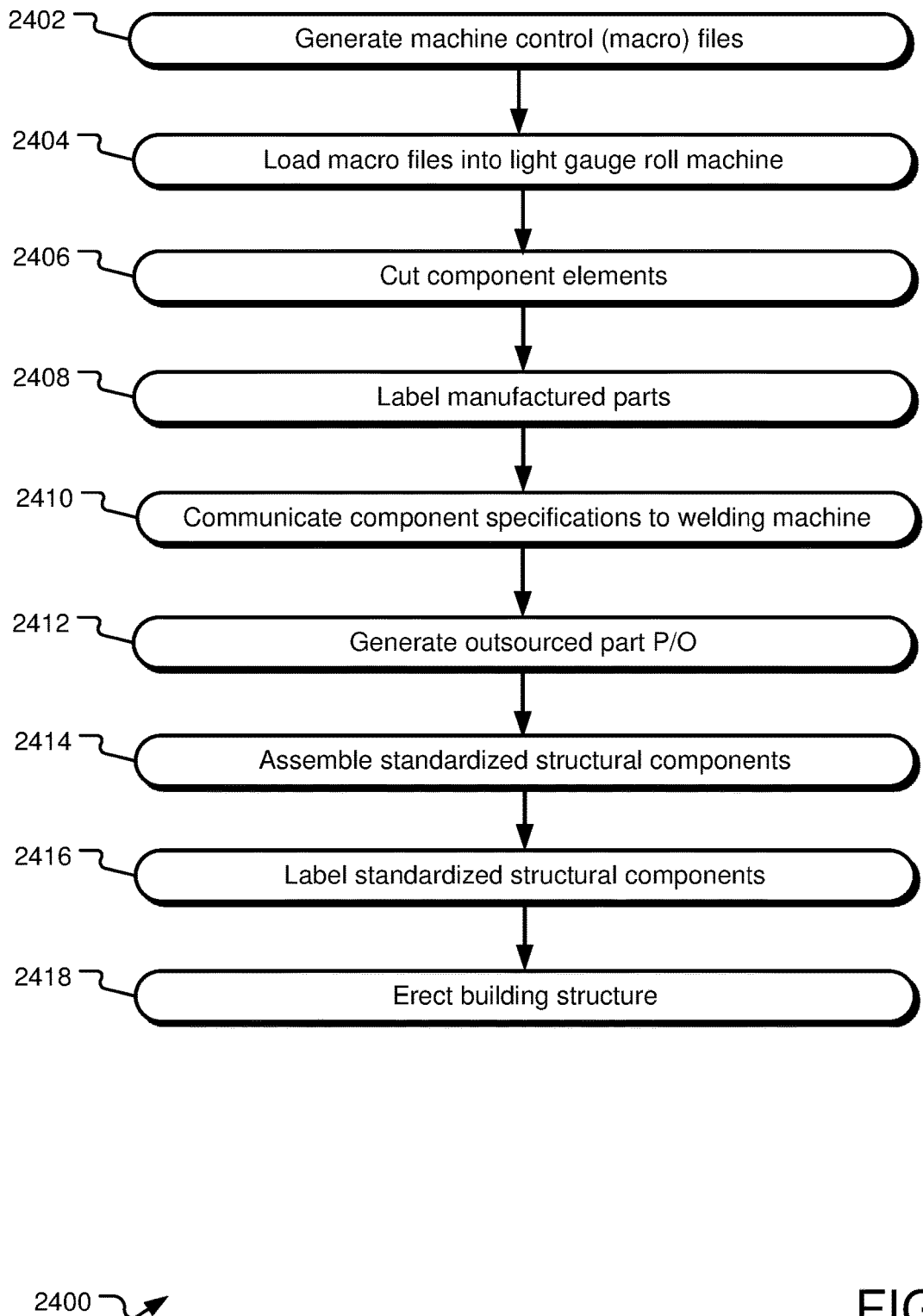
Figure 25:
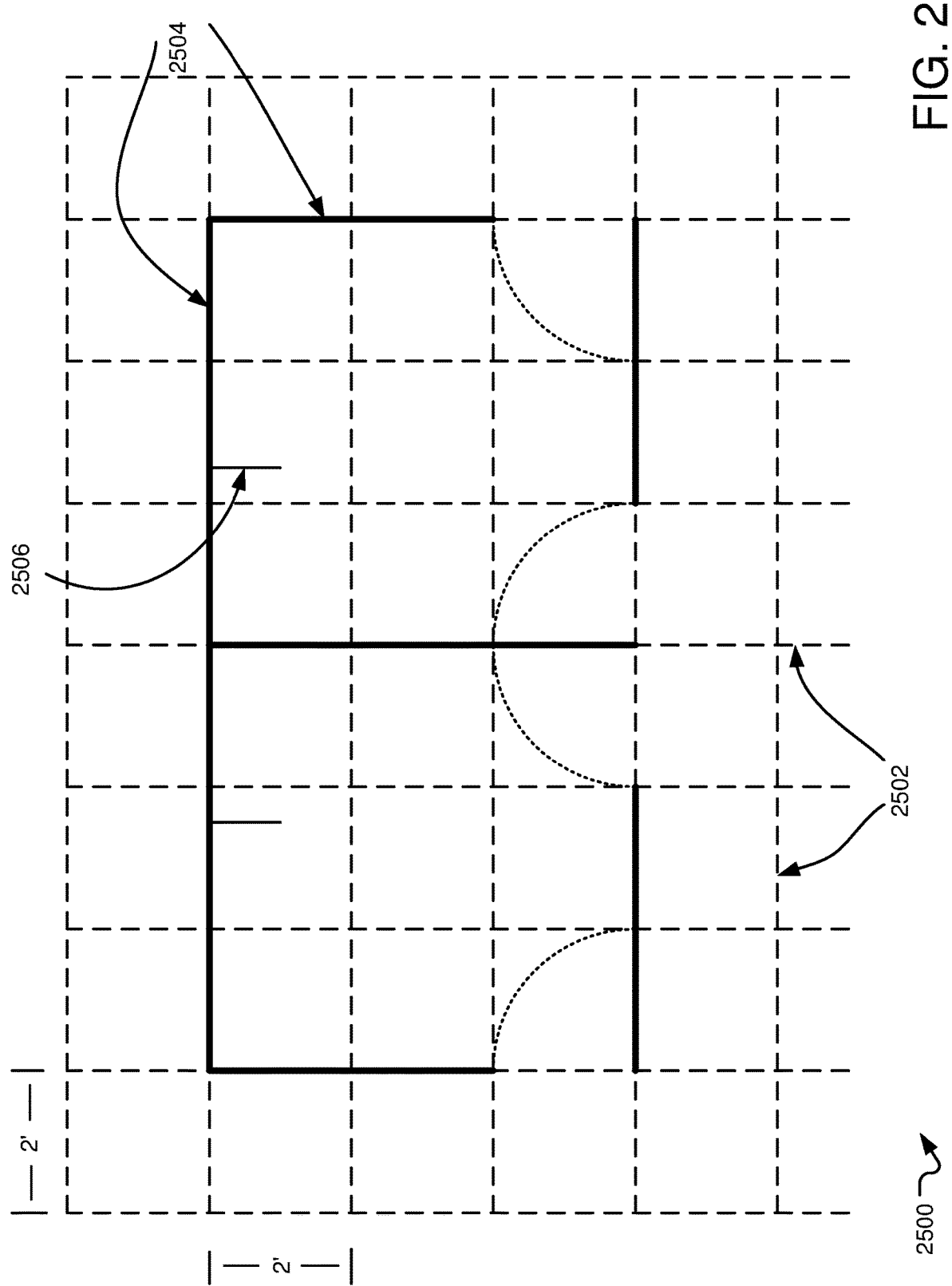
Figure 26:
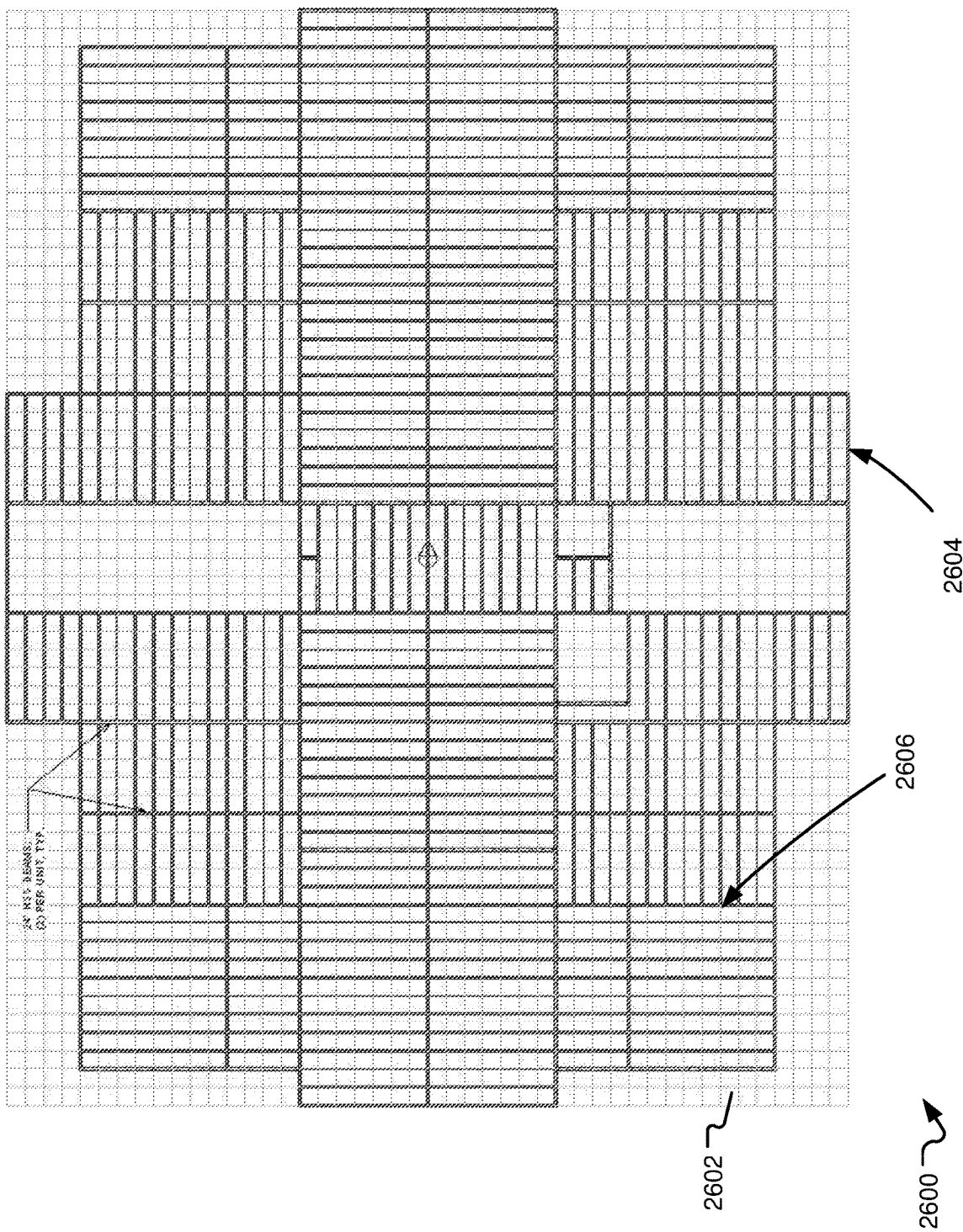
Figure 27:
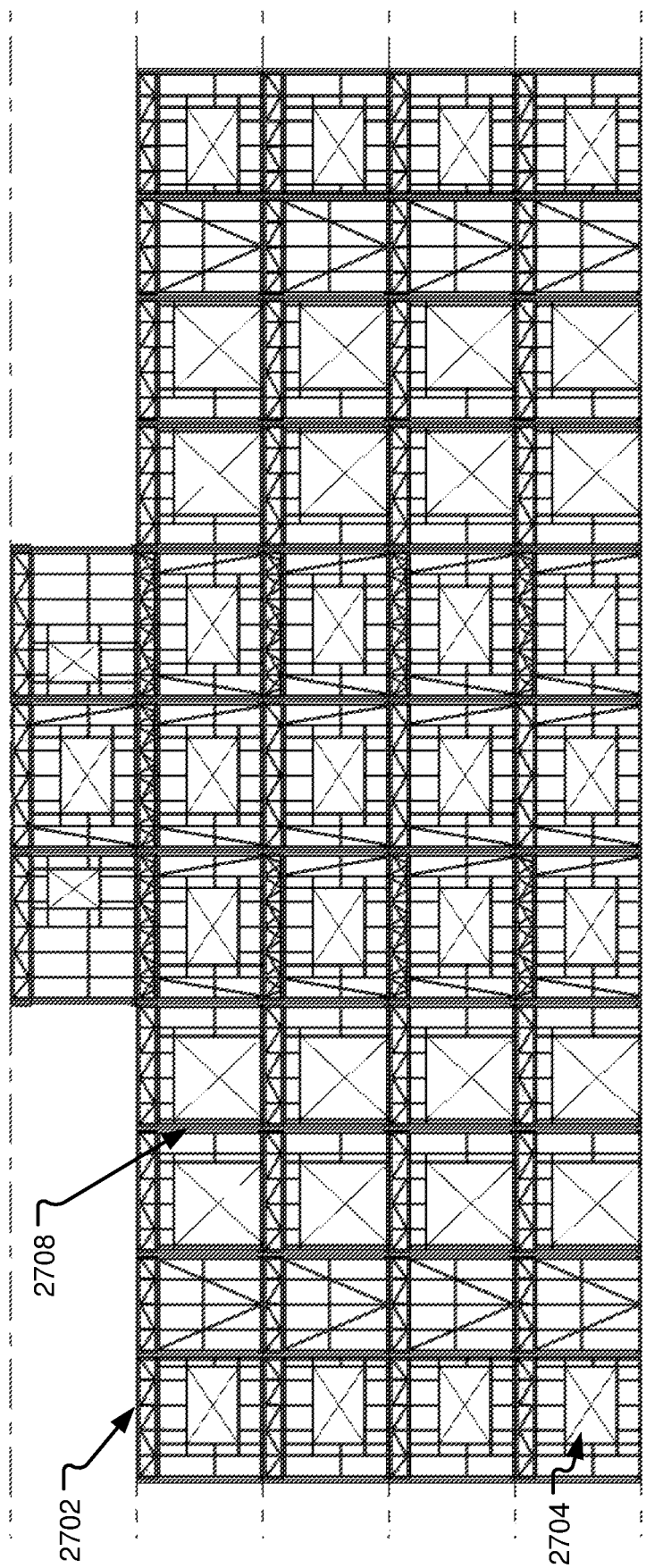
Figure 28:
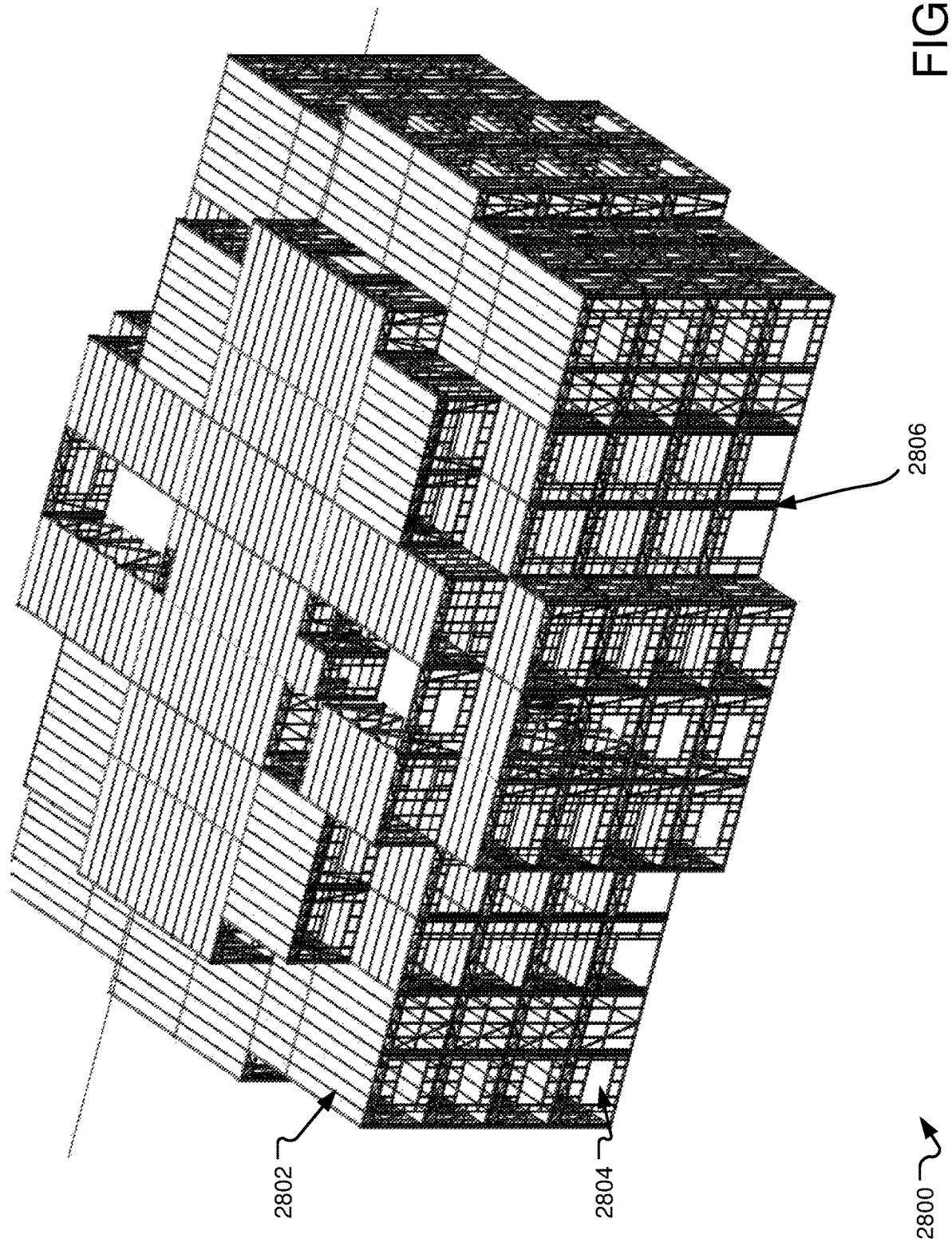
Figure 29:
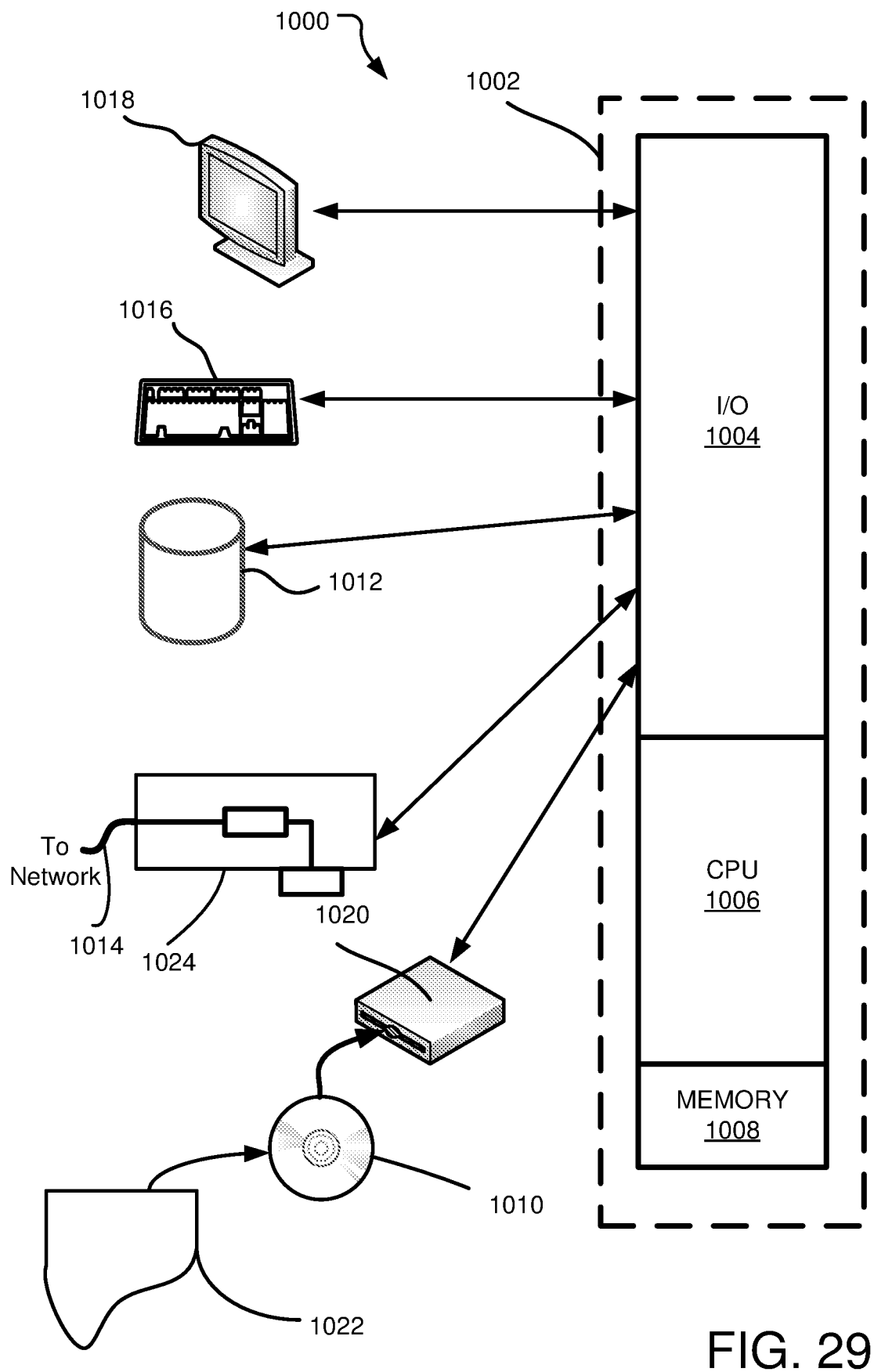

FIGS. 3 and 3.1 illustrate a V-Braced horizontal truss panel;

FIGS. 4, 4.1, and 4.2 illustrate various open horizontal truss panels;

FIG. 5 illustrates a truss for attachment to horizontal truss panels;

FIG. 6 illustrates a structural column assembly for attaching horizontal truss panels to one another;

FIGS. 7 and 8 show the manner of attaching a horizontal truss panel such as shown in FIGS. 3, 3.1, 4, 4.1, and 4.2 to the structural column assembly of FIG. 6;

FIG. 9 shows a unified horizontal truss panel wall line having open and V-braced horizontal truss panels in a Unified Truss Construction System (UTCS) wall line;

FIG. 10 illustrates the truss of FIG. 5;

FIG. 11 shows the truss/stud hangar of FIG. 6;

FIG. 12 illustrate a portion of the structural column assembly of FIG. 6;

FIG. 13 illustrates trusses connected to horizontal truss panels;

FIG. 14 illustrates trusses connected to horizontal truss panels to form a UTCS open span assembly creating a wall line;

FIG. 15 illustrates a UTCS building section formed as an assembly of multiple floors of a UTCS structure;

FIG. 16 shows alignment of the structural column assemblies of FIG. 6 in a building;

FIG. 17 illustrates a three-dimensional view and a two-dimensional view of the floor-to-floor sections of a section of this building;

FIG. 18 shows the transfer of forces to the structural column assemblies of FIG. 6;

FIG. 19 illustrates an example block diagram of a system for using the standardized structural components;

FIG. 20 illustrates an alternative example block diagram of a system for using the standardized structural components;

FIG. 21 illustrates an example flowchart of a method of using the standardized structural components;

FIG. 22 illustrates example of structural panel names generated by the system disclosed herein;

FIG. 23 illustrates example flowchart of a method for using specialized code to track building construction progress;

FIG. 24 illustrates an example flowchart of a method for using machine control files to control the manufacturing of the standardized structural components;

FIG. 25 illustrates an example geometric grid used by the method and system disclosed herein;

FIG. 26 illustrates an example plan view of a geometric grid with various standardized structural components along the grid lines;

FIG. 27 illustrates an example elevation view of a building structure using various standardized structural components;

FIG. 28 illustrates a three-dimensional view of a structure generated using various standardized structural components; and FIG. 29 illustrates an example computing system that can be used to implement one or more components of the method and system described herein.

Figure 30:
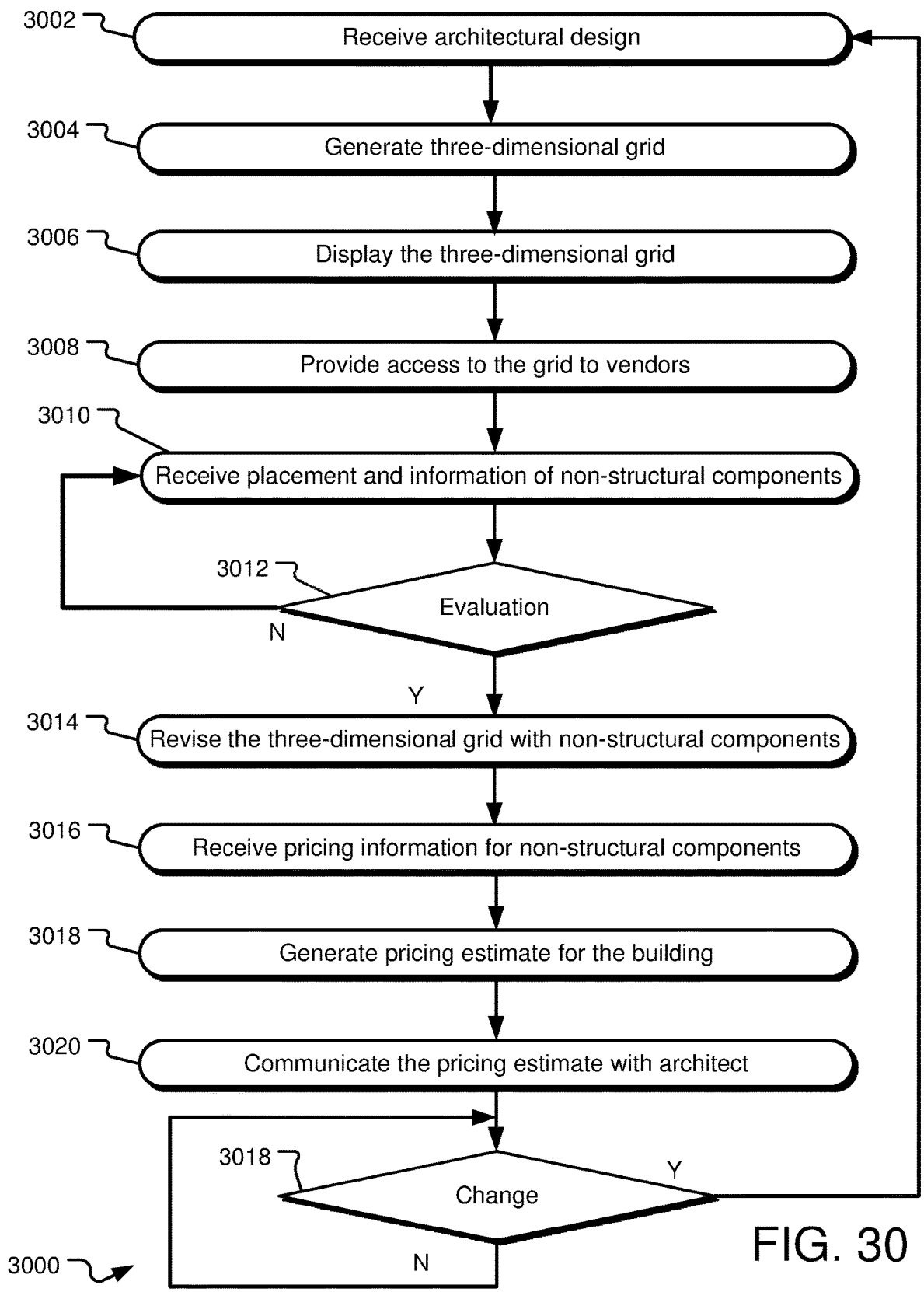

FIG. 30 illustrates an example flowchart for using an integrated construction portal disclosed herein.

Figure 31:
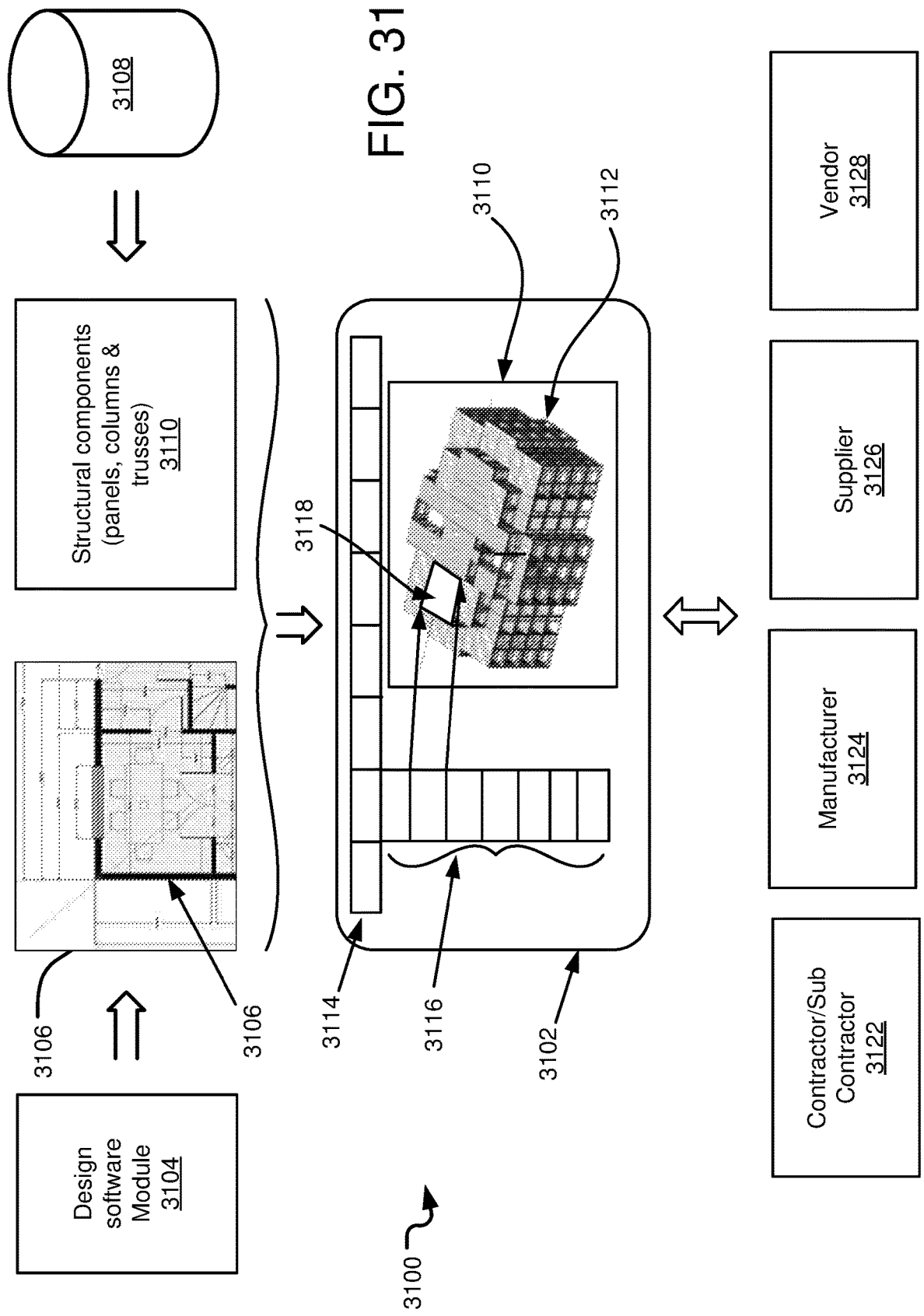

FIG. 31 illustrates an example block diagram of an integrated construction portal disclosed herein.

Figure 32:
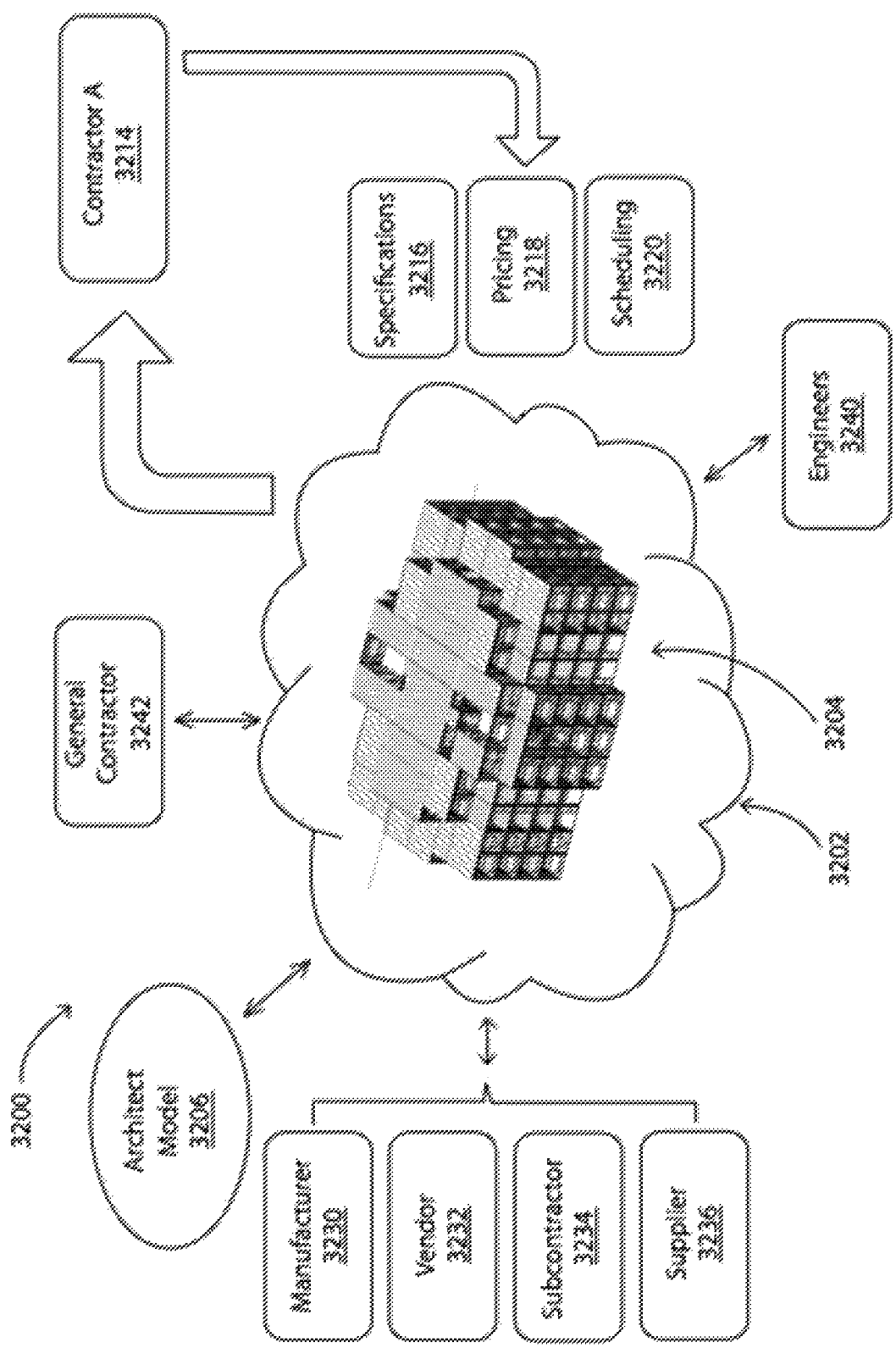

FIG. 32 illustrates an alternative example block diagram of the integrated construction portal disclosed herein.

DETAILED DESCRIPTIONS

The Unified Truss Construction System (UTCS) disclosed herein is a unique, new, and innovative structural system for single and multistory buildings, based on standardized structural panels. The system employs a limited number of configurations of uniquely engineered, light gauge metal framed vertical wall panels (horizontal truss panels), light-gauge-metal floor and ceiling trusses, cold rolled square or rectangular steel tubing (structural columns), and unique connecting plates and clips.

Unlike conventional approaches to designing and engineering a building's structure, where many different assemblies (walls, columns, beams, bracing, strapping, and the fasteners that fasten them together) are employed to manage vertical live load and dead load forces, and lateral forces, UTCS manages these forces through a limited number of uniquely designed standardized horizontal truss panels, which are assembled with structural columns and trusses. This unique assembly of elements effectively supports and transfers vertical and lateral forces from the walls, floor, ceiling, and roof to UTCS' redundant and dense column system. Accordingly, columns absorb these vertical and lateral forces such that UTCS is not a vertical bearing wall structural system and eliminates the need for "hot formed" structural steel (weighted steel or "red iron") and concrete as part of a building's structural system.

UTCS framing members are made from specially designed computerized roll forming machines. These machines manufacture framing studs or members from cold rolled steel commonly referred to as "coiled steel." Each stud is cut to size, pre-drilled for fastening screws, with countersinks at the assembly screw head area, pre-punched for chasing mechanical, electrical, and plumbing ("MEP") assemblies and rough-ins, pre-punched for passing vertical and horizontal bracing, and labeled for assembly. The machines read stud specifications from CAD files.

Horizontal truss panels and the trusses used in UTCS are constructed with framing members roll formed from light gauge steel, such as 18 to 14 gauge steel, depending on building height and code requirements. There are two profiles of framing members used in the horizontal truss panels, a stud 10 illustrated in FIG. 1 and a track 12 illustrated in FIG. 2. The stud 10 and the track 12 are each rolled from light gauge steel, such as 18 to 14 gauge steel.

Figure 1:
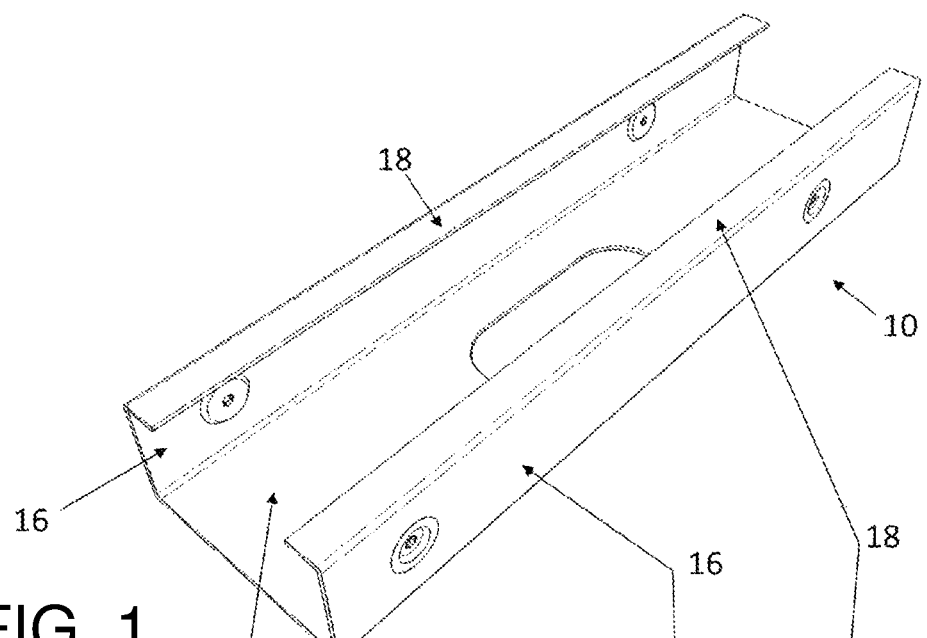
FIG. 1 illustrates a stud for use as a framing member in horizontal truss panels.

Each of the stud 10 and the track 12 includes a web 14, flanges 16, and lips 18 formed as illustrated in FIG. 1. The flanges 16 extend in the same direction at substantially right angles from opposing sides of the web 14, and the lips 18 extend inwardly from ends of the flanges 16 such that the lips 18 parallel the web 14. The stud 10 and the track 12 differ mainly in that the flanges 16 of the track 12 are slightly higher than the flanges 16 of the stud 10, and the web 14 of the track 12 is slightly wider than the web 14 of the stud 10. These relative dimensions allow the stud 10 to slide into or through the track 12 without the need to compress the flanges 16 of the stud 12, which affects its structural performance.

UTCS employs a limited number, such as two, configurations of horizontal truss panels. These horizontal truss panels are the structural wall elements of UTCS. If only two such configurations are used, they are (a) a V-braced horizontal truss panel 20/22 shown in FIG. 3 or FIG. 3.1, which contains a "V" shaped brace ("V-brace"), and (b) an open horizontal truss panel 24 shown in FIG. 4, which does not contain a V-brace.

An open horizontal truss panel 24 is generally used in any area of a building having large openings (windows, doors, pass-throughs, and the like) in a UTCS structure. The open horizontal truss panel 24 is engineered to support and transfer vertical live (occupancy, for example) and dead load forces (e.g., drywall, MEP assemblies, insulation, and the like) from floor and ceiling assemblies attached either to or proximate to each panel within a building ("Local Forces"). The V-braced horizontal truss panel 20/22 is engineered to support vertical local forces and lateral forces acting on the structure (wind and seismic, for example).

As shown in FIG. 3, the V-braced horizontal truss panel 20 has a top track 26 and a bottom track 28. Inboard of the top track 26 is a continuous horizontal brace comprised of back-to-back (web-to-web) tracks 30 and 32, (referred to as double horizontal bracing), which are anchored by fasteners 34 such as bolts or screws to side studs 36 and 38 at the sides of the V-braced horizontal truss panel 20. The top track 26 and the bottom track 28 are also anchored by fasteners 34 to the side studs 36 and 38. The area between the continuous horizontal brace formed by the tracks 30 and 32 and the top track 26 contains vertical angled webbing 40 made from studs. This braced area in FIG. 3 acts as a truss attachment area 42 within the V-braced horizontal truss panel 20 for the attachment of trusses 106 discussed below, and supports and transfers forces exerted on the V-braced horizontal truss panel 20 to the structural columns discussed below and attached to each of the side studs 36 and 38 of the V-braced horizontal truss panel 20.

Figure 2:
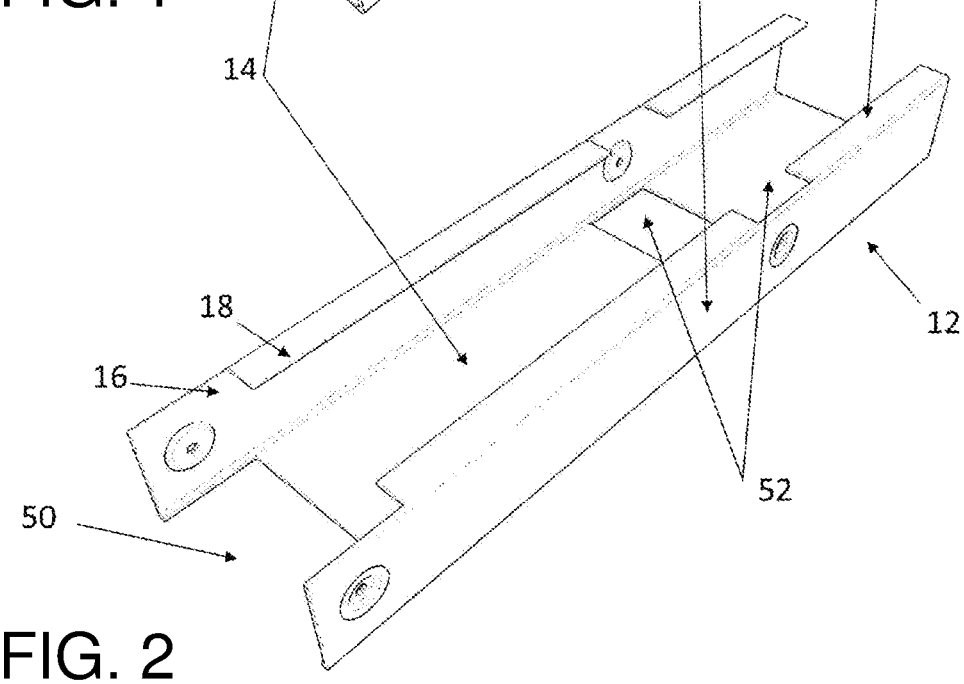
FIG. 2 illustrates a track for use as a framing member in horizontal truss panels.

The V-braced horizontal truss panel 20 also has two inboard studs 44 and 46 and a center stud 48 anchored by fasteners 34 to the top and bottom tracks 26 and 28 and to the tracks 30 and 32. The side studs 36 and 38 pass through end cutouts 50 in the ends of the web 14 and in the lips 18 of the tracks 30 and 32 such that the flanges 16 of the studs 36 and 38 abut the flanges 16 at the ends of the tracks 26, 28, 34, and 36. These end cutouts 50 are shown in FIG. 2. The fasteners 34 are at these abutment areas. Similarly, the inboard studs 44 and 46 and the center stud 48 pass through interior cutouts 52 of the webs 14 and lips 18 of the tracks 30 and 32 such that an exterior of the flanges 16 of the studs 36 and 38 and of the center stud 100 abut the interior of the flanges 16 of the tracks 26, 28, 34, and 36. These interior cutouts 52 are also shown in FIG. 2. The fasteners 34 are at these abutment areas. The five vertical studs 36, 38, 44, 46, and 48, for example, may be spaced 24" on center. The point at which the inboard studs 44 and 46 and the center stud 48 pass through the tracks 30 and 32 is a hinge connection (i.e., a single fastener allows for rotation). The studs of the V-braced horizontal truss panel 20 also serve to support drywall, conduit, wiring, plumbing assemblies, etc.

The V-braced horizontal truss panel 20 also contains a continuous V-shaped bracing. This V-Bracing is unique in its design and engineering. The two legs of the V-brace are V-brace studs 54 and 56 such as the stud 10 shown in FIG. 1. The V-brace stud 54 is anchored to the side stud 36 just below the tracks 30 and 32 and to the bottom track 28 by the fasteners 34 and passes through an interior cutout 58 in the web 14 of the inboard stud 44. This interior cutout 58 is shown in FIG. 1. The web 14 of the V-brace stud 54 abuts one flange 16 of each of the studs 36 and 44 and the track 28. These abutment areas receive the fasteners 34 as shown.

Similarly, the V-brace stud 56 is anchored to the side stud 38 just below the tracks 30 and 32 and to the bottom track 28 by the fasteners 34 and passes through the interior cutout 58 in the inboard stud 46. The web 14 of the V-brace stud 56 abuts one flange 16 of each of the studs 38 and 46 and the track 28. These abutment areas receive the fasteners 34 as shown.

The attachment of the V-brace studs 54 and 56 to the studs 36 and 38 and to the track 28 require that the ends of the V-brace studs 54 and 56 be angles as shown in FIG. 3. These angled ends permit multiple fasteners 34 to be used to anchor the V-brace studs 54 and 56 to their corresponding side studs 36 and 38.

The V-brace studs 54 and 56 are positioned with their webs perpendicular to the webs of the studs 36, 44, 48, and 38 of the V-braced horizontal truss panel 20. Also, the V-brace studs 54 and 56 run continuously from immediately below the tracks 32 and 34 through the inboard studs 44 and 46 to the apex of a "V" at substantially the middle of the bottom track 28. The connection at the apex of the V-bracing is facilitated by an apex plate 60 and additional fasteners 34, which interconnect the V-brace studs 54 and 56 and the center stud 48. The plate 60, the bottom track 28, and the stud 48 and the V-brace studs 54 and 56 are interconnected by the lower three fasteners as shown in FIG. 3. The inboard stud 46 is also attached by fasteners 34 to the top track 26 and to the tracks 30 and 32 at the point where the inboard stud 46 passes through the interior cutouts 52 in the tracks 30 and 32. The apex plate 60 may be formed from a material such as 18-14 gauge cold roll steel.

The connections of the V-brace studs 54 and 56, to the side studs 36 and 38, to the center stud 48, and to the track 28 are moment connections and improve the lateral structural performance of the V-braced horizontal truss panel 20.

These connections facilitate the transfer of most of the lateral forces acting on the V-braced horizontal truss panel 20 to the structural column of the system (discussed in further detail below).

The V-braced horizontal truss panel 20 also contains a track 62 providing horizontal bracing. The track 62 is located, for example, mid-way in the V-Brace formed by the V-brace studs 54 and 56. The track 62 has the end cutouts 50 to accommodate the inboard studs 44 and 46, has the interior cutout 52 to accommodate the center stud 48, and is anchored by fasteners 34 to the inboard studs 44 and 46 and to the center stud 48. The track 62 contributes to the lateral-force structural performance of the V-braced horizontal truss panel 20.

The V-braced horizontal truss panel 20 may contain other bracing and backing as necessary for building assemblies like drywall, cabinets, grab bars and the like. The V-braced horizontal truss panel 20 is used as both interior (demising and partition) structural walls and exterior structural walls. The V-braced horizontal truss panel 20/22 may also accommodate windows and pass-throughs, although the space is limited as can be seen from the drawings.

The V-braced horizontal truss panel 22 of FIG. 3.1 has the same construction as the V-braced horizontal truss panel 20 of FIG. 3 except that the V-brace stud 54 forming half of the V-brace of FIG. 3 is replaced by two studs 64 and 66 whose lips 18 abut one another, and the V-brace stud 56 forming the other half of the V-brace of FIG. 3 is replaced by two studs 68 and 70 that may or may not abut one another. Thus, the studs 64, 66, 68, and 70 form a double V-brace for the V-braced horizontal truss panel 22 of FIG. 3.1 to provide extra strength.

As shown in FIG. 4, the open horizontal truss panel 24 has a top track 80 and a bottom track 82. Inboard of the top track 80 is a continuous horizontal brace comprised of back-to-back (web-to-web) tracks 84 and 86, (referred to as double horizontal bracing), which are anchored by fasteners 34 such as bolts or screws to side studs 88 and 90 at the sides of the open horizontal truss panel 24. The top track 80 and the bottom track 82 are also anchored by fasteners 34 to the side studs 88 and 90. The area between the continuous horizontal brace formed by the tracks 84 and 86 and the top track 80 contains vertical angled webbing 92 made from studs. This braced area in FIG. 4 acts as a structural truss 94 for the open horizontal truss panel 24, and supports and transfers forces exerted on the open horizontal truss panel 24 to the structural columns discussed below and attached to each of the side studs 88 and 90 of the open horizontal truss panel 24.

The open horizontal truss panel 24 also has two inboard studs 96 and 98 and a center stud 100 anchored by fasteners 34 to the top and bottom tracks 80 and 82 and to the tracks 84 and 86. The side studs 88 and 90 pass through end cutouts 50 in the ends of the web 14 and of the lips 18 of the tracks 84 and 86 such that the flanges 16 of the studs 88 and 90 abut the flanges 16 at the ends of the tracks 80, 82, 84, and 86. These end cutouts 50 are shown in FIG. 2. The fasteners 34 are at these abutment areas. Similarly, the inboard studs 96 and 98 and the center stud 100 pass through interior cutouts 52 of the webs 14 and of the lips 18 of the tracks 84 and 86 such that the flanges 16 of the studs 96 and 98 and of the center stud 100 abut the flanges 16 of the tracks 80, 82, 84, and 86. These interior cutouts 52 are also shown in FIG. 2. The fasteners 34 are at these abutment areas. The five vertical studs 88, 90, 96, 98, and 100, for example, may be spaced 24" on center. The point at which the inboard studs 96 and 98 and the center stud 100 pass through the tracks 84 and 86 is a hinge connection (i.e., a single fastener allows for rotation). The studs of the open horizontal truss panel 24 also serve to support drywall, conduit, wiring, plumbing assemblies, etc.

The open horizontal truss panel 24 also contains a track 102 performing horizontal bracing. The track 102 is located, for example, mid-way between the tracks 82 and 86. The horizontal bracing track 102 includes the end cutouts 50 through which the side studs 88 and 90 pass, has three interior cutouts 52 through which the inboard studs 96 and 98 and the center stud 100 pass, and is anchored by fasteners 34 to the side studs 88 and 90, to the inboard studs 44 and 46, and to the center stud 48. The flanges 16 of the studs 88, 90, 96, 98, and 100 abut the flanges 16 of the track 102. The fasteners 34 are applied to these abutment areas. The open horizontal truss panel 24 is engineered to handle vertical local forces.

The open horizontal truss panel 24 is designed to accommodate windows, doors, and pass-throughs. The open horizontal truss panel 24, for example, may be 20' wide or less. FIGS. 4.1 and 4.2 illustrate open horizontal truss panels with one or more openings for windows, doors, and pass-throughs. FIG. 4.1 illustrates typical chase openings 104 through which MEP assemblies may be passed. These chase holes 104 may be formed in the V-braced horizontal truss panels 20 and 22 as well. FIG. 4.2 illustrates several open horizontal truss panels with openings for doors.

The open horizontal truss panel 24 may contain other bracing and backing as necessary for building assemblies like windows, doors, pass throughs, drywall, cabinets, grab bars and the like. The open horizontal truss panel 24 is used as both interior (demising and partition) structural walls and exterior structural walls.

The horizontal truss panels described above are tall enough to accommodate the floor to ceiling areas of buildings, and to accommodate attachment of trusses, such as a truss 106 shown in FIG. 5. The truss 106 is attached to the truss attachment area 42 and includes a top stud 108 and a bottom stud 110 interconnected by an angled webbing 112 made from studs such that the angled webbing 112 is attached to the top and bottom studs 108 and 110 by the fasteners 34. The truss 106 is attached to the truss attachment area 42 of a horizontal truss panel 114 by use of truss/stud hangers 116 and the fasteners 34. Although the horizontal truss panel 114 is shown as the V-braced horizontal truss panel 20/22, the horizontal truss panel 114 can be any of the horizontal truss panels described herein. The truss/stud hangers 116 are discussed more fully below in connection with FIG. 11.

The truss hangers 116 may be formed from a material such as 18-14 gauge cold roll steel.

The truss 106 is also shown in FIG. 10. Trusses used in UTCS are made from the studs 10. These trusses have the top and bottom studs 108 and 110 and the internal angled webbing 112. The trusses 106 do not have side or end webbing connecting their top and bottom chords 108 and 110. The truss 106 may be formed from light gauge steel, such as 18 to 14 gauge steel. The gauge and length f the truss 106 varies depending on application and width of floor span.

FIG. 6 illustrates a structural column assembly 130 that includes a structural column 132 having a top plate 134 and a bottom plate 136 welded to the top and bottom of the structural column 132 so that the top plate 134 covers the top of the structural column 132 and the bottom plate 136 covers the bottom of the structural column 132. The structural column 132, for example, may be four sided, may be hollow, and may vary in wall thickness depending on building height and code requirements. The top plate 134 and the bottom plate 136 are shown in FIG. 6 as being linear in the horizontal direction and are used where two walls are joined side-by-side so as to share a common linear horizontal axis. However, the top plate 134 and the bottom plate 136 may be "L" shaped plates when two walls are to be joined at a corner such that the horizontal axes of the two walls are perpendicular to one another.

One or more bolts 138 are suitably attached (such as by welding or casting) to the top plate 134. The bolts 138 extend away from the top plate 134 at right angles. Each end of the bottom plate 136 has a hole 140 there through. Accordingly, a first structural column 132 can be stacked vertically on a second structural column 132 such that the bolts 138 of the top plate 134 of the second structural column 132 pass through the holes 140 of the bottom plate 136 of the first structural column 132. Nuts may then be applied to the bolts 138 of the top plate of the second structural column 132 and tightened to fasten the first and second structural columns 132 vertically to one another.

The top and bottom plates 134 and 136 are slightly wider than the track 12 used for the horizontal truss panel 20/22/24 and vary in thickness depending on building height and code requirements. The through-bolting provided by the bolts 138 and holes 140 permit the structural columns 132 to be connected to one another vertically and to other assemblies within a building (roof, foundations, garages, etc.).

The structural columns 132 are connected to horizontal truss panels 20/22/24 by way of stud sections 142 of the stud 10. The stud sections 142 are welded or otherwise suitably fastened to the top and bottom of the structural column 132. A stud section 144 is fastened by weld or suitable fastener at about the middle of the structural column 130 such that its web 14 faces outwardly. This stud section 144 is a "hold-off" to keep the studs 36, 38, 88, and 90 of the horizontal truss panels from deflecting. Unification plates such as 154 may or may not be used at this location.

The material of the structural column 132, for example, is cold rolled steel. The structural column 132 may be hollow and have a wall thickness that varies depending on application and code. The material of the plates 134 and 136 and for the truss hangars 144 and 146, for example, may be 18-14 gauge cold roll steel.

FIGS. 7 and 8 shows the manner of attaching a horizontal truss panel such as the horizontal truss panels 20, 22, and 24 to the structural column assembly 130. A unified horizontal truss panel is created when the structural column assembly 130 is attached to the horizontal truss panel 20/22/24 using four truss hanger unification plates 150, which have a stud insertion projection for attachment of the trusses 106 discussed in further detail below, and two flat unification plates 154, all of which are attached by fasteners 34 to the side stud 36 and 38 of the horizontal truss panel 20/22/24 and the stud sections 142. The stud sections 144 as shown in FIG. 7 act to "hold-off" studs 36 and 38 so that these studs do not deflect through the space between the side studs 36 and 38 and the structural column 132. Unification plates such as 154 may or may not be used at this location.

In a UTCS structure, a section or length of wall is assembled by attaching a number (depending on wall length) of horizontal truss panels together using the structural column assemblies 130. The open horizontal truss panels 24 are used as a wall section(s) in buildings where there are larger openings like windows, doors, and pass-throughs. The V-braced horizontal truss panels 22/22 are used as wall section(s) generally throughout the rest of the structure so as to provide dense lateral support of the structure. FIG. 9 shows a horizontal truss panel wall line having open and V-braced horizontal truss panels 24 and 20/22 in a UTCS wall line.

As indicated above, the truss 106 is attached to the horizontal truss panel 20/22/24 by way of the truss/stud hangars 116 and the fasteners 34 located at the inboard studs 44 and 46 and the center stud 48. The truss/stud hangar 116 is shown in FIG. 11 and includes a stud insertion projection 152 to be received within the top stud 108 of the truss 106 as illustrated in FIG. 5 and, when inverted 180 degrees as illustrated in FIGS. 5 and 8, within the bottom stud 110 of the truss 106. The truss/stud hanger 116 also includes L-shaped flanges 172 used to fasten the truss/stud hangers to the top track 26 and, inverted, to the horizontal bracing 30 and 32 of the horizontal truss panels.

The trusses 106 are connected to the horizontal truss panels 20/22/24 by inserting the end of the top stud 108 of the truss 106 into the insertion projection 152 and fastening by fasteners 34, and connecting by fasteners 34 the L-shaped flanges 172 to the web 14 and flange 16 of the top track 26 and by connecting by fastener 34 a projection tab 176 of the truss hangar 116 to the top flange 16 of the stud 108. The bottom stud 110 of the truss 106 is connected by inverting the truss/stud hanger 116 by 180 degrees, inserting the end of the bottom stud 110 of the truss 106 into the insertion projection 152 and fastening by fasteners 34, connecting by fasteners 34 the L-shaped flanges 172 to the web 14 of the tracks 30 and 32, and by connecting by fastener 34 the projection tab 176 to the bottom flange 16 of the stud 110.

A truss 106 is also attached at each of the structural columns 132 by way of an insertion projection 152 on the unification plate 150. The end of the top stud 108 of the truss 106 is inserted over the insertion projection 152 of the unification plate 150 and fastened with fasteners 34 to the web 14 of the stud 108. The projection tab 176 is fastened by a fastener to the top flange 16 of the stud 108. The bottom stud 110 of the truss 106 is connected by way of insertion of the end of the stud 110 over the insertion projection 152 of an unification plate 150 that is rotated 180 degrees. Fasteners 34 are used to connect the insertion projection 152 to the web 14 of the stud 110. The projection tab 176 is attached by way of a fastener to the bottom flange 16 of the stud 110.

FIG. 13 illustrates the trusses 106 connected to horizontal truss panels 20/22/24.

FIG. 14 illustrates the trusses 106 connected to horizontal truss panels 20/22/24 forming a UTCS open span assembly where the horizontal truss panels 20/22/24 are assembled with the trusses 106 to create a wall line. The trusses 106 support a floor and ceiling assembly.

Attaching the trusses 106 to the horizontal truss panels in this manner incorporates the truss 106 into the horizontal truss panels 20/22/24, eliminating the "hinge-point" that exists where a wall assembly sits on a floor, or where a ceiling assembly sits on top of a wall. This connection unifies the trusses 106 and horizontal truss panels 20/22/24, in effect enabling the entire wall and floor system to act together as a "truss." This configuration facilitates the transfer of forces on the floor, ceiling, and horizontal truss panels 20/22/24 to their attached structural column assemblies 130. Accordingly, vertical and lateral forces are not transferred vertically horizontal truss panel to horizontal truss panel. When subflooring and drywall are incorporated into the building, the entire system acts as a "diaphragm."

FIG. 15 illustrates a UTCS building section formed as an assembly of multiple floors of a UTCS structure. In a UTCS building or structure, the horizontal truss panels 20/22/24 are laid out such that the structural column assemblies 130 on one floor line up vertically with the structural column assemblies 130 on the floor below, and so on, down to a foundation.

FIG. 16 shows this alignment of the structural column assemblies. FIG. 16 also illustrates the density of the structural column assemblies 130 in a UTCS structure.

FIG. 17 illustrates a three-dimensional view and a two-dimensional view of the floor-to-floor joints of this assembly. It shows that horizontal truss panels 20/22/24 do not contact or bear on each other, as is otherwise typical in "bearing wall" and steel and concrete structures. The horizontal truss panels on one floor of a UTCS structure do not carry load from the floor above. This load is instead transferred to and carried by the structural column assemblies 130. Each "floor" or elevation of the structure dampens and transfers its vertical live and dead load forces to the structural column assemblies 130, where they are dampened and transferred vertically to the foundation of the building.

The V-braced horizontal truss panels 20/22 dampen and transfer the lateral forces acting on the building to the redundant structural column assemblies 130 in the structure. This transfer of forces is illustrated in FIG. 18. The blow up portion of FIG. 18 also illustrates that the panels do not bear on each other vertically and that the forces (arrows) are not transferred vertically from one panel to the other. Rather the vertical and lateral forces are transferred laterally to the structural column assemblies 130. This type of load transfer is facilitated by the unique design and assembly of the system. Both the horizontal truss panels 20/22/24 and the trusses 106 act as a unified truss system.

UTCS may employ horizontal truss panels of varying widths from 20' to 2', the most common being V-braced horizontal truss panels 20/22 measuring 8' and 4'. These panels lead to a significant redundancy of the structural column assemblies 130 within the structure. Each open horizontal truss panel 24 acts to support and mitigate only those vertical local forces proximate to their attached structural column assemblies 130. The V-braced horizontal truss panels 20/22 act to support vertical local forces as well as lateral forces acting on the structure. Because of the unique manner in which the horizontal truss panels 20/22/24 transfer vertical and lateral forces and the redundancy of the structural column assemblies 130 in the system, there in no need to configure panels differently from floor-to-floor. Only the width and gauge of the tracks 12, the studs 10, and V-brace vary, depending on building height and code requirements.

Interior non-structural partition walls that separate spaces within a UTCS building are constructed from light gauge steel (typically 24-28 gauge) and are typical in Type I and Type II steel frame construction.

UTCS is extremely efficient in managing vertical and lateral forces on a building. With UTCS the need to build a bearing wall structure or heavy structural core is eliminated, vastly reducing costs over traditional construction practices. UTCS saves time as well because the structure of a building is erected from a limited number of pre-assembled panels. This also dramatically reduces the cost of engineering the structure of buildings.

UTCS is unique and innovative. It can be built on nearly any foundation system including slabs, structured parking, retail and commercial buildings. UTCS employs a framing technology that is based on a system-built, panelized approach to construction. UTCS uses panelized building technology and innovative engineering to significantly reduce the cost of design, material, and erection of a building. UTCS technology and engineering is a new structural system and method of assembling single and multistory buildings.

Certain modifications of the present invention have been discussed above. For example, although the present invention is particularly useful for constructing and assembling buildings without relying on concrete and/or structural steel framing, heavy steel let-in bracing, and heavy steel and/or concrete panels, it can also be applied to buildings having concrete and/or structural steel framing, heavy steel let-in bracing, and heavy steel and/or concrete panels. Other modifications will occur to those practicing in the art of the present invention.

FIGS. 1-18 and the accompanying disclosure illustrate using a limited number of configurations for standardized structural components. Specifically, the standardized structural components allow for providing integration between architectural and structural design of building structures, production of components for such building structures, and the eventual erection of such building structures using the standardized structural components. The following disclosure illustrates various methods and systems for using these standardized structural components. Specifically, the system and method disclosed below eliminates the implementation inefficiencies, unnecessary costs, lack of coordination, unnecessary delays, and other problems associated with conventional building design and construction projects.

The fully integrated method and system disclosed below provides an integrated platform for design, manufacturing, and construction of building structures. Furthermore, the system disclosed herein also provides an active design functionality that assists in determining how other elements and building components, such as, rough-ins, finishes, windows, stairs, elevators, etc., relate to and are automatically sized and or located in relation to the structure of a building. The automation and coordination provided by the system enables greater design efficiency, better overall coordination and time and cost savings on architecture, structural engineering, mechanical, electrical and plumbing (MEP) engineering, manufacturing, and construction.

FIG. 19 illustrates an example block diagram of a system 1900 for using the standardized structural components disclosed above. Specifically, the system 1900 includes a computer aided design (CAD) software module 1902 that is used to generate a design file 1904 for a building. An example of the CAD software 1902 is the Revit architectural design software from Autodesk. The design file 1904 may be generated in a format, such as AutoCAD DWG file, DXF file, JPEG file, BMP file, GIF file, TXT file, etc. In one implementation of the system 1900, the design file 1904 also includes designation of one or more walls 1906 of the building as standardized structural panel walls. For example, such designation of the walls may be provided by the architect during the design phase of a building.

The system 1900 also includes a database 1908 that stores structural details for various standardized structural components 1910. For example, the database 1908 includes records that provide the definition of the trusses, the truss components, and other standardized structural components 1910 discussed above in FIGS. 1-18. Furthermore, these records may also include other characteristics of these standardized structural components 1910, such as their dimensions, lateral and vertical load bearing capacities, shear capacities, the identification of studs that attach to the particular panels, etc.

While system 1900 illustrates the database 1908 as being separate from the CAD software module 1902, in one implementation, the database 1908 may be integrated with the CAD software module 1902. Alternatively, the database 1908 may be accessible to the CAD software module 1902 via a plug-in to the CAD software module 1902 that is designed to access the database 1908. Such an implementation allows the database 1908 to be located remotely on a database server accessible to a large number of users of different CAD software modules.

The system 1900 includes a geometric grid module 1912 that uses the design file 1904 and the standardized structural components 1910 as its input. The grid module 1912 may be configured to reside in the CAD software module 1902 as an add-in. A designer generating a building design using the CAD software module 1902 may select to activate the grid module 1912. Alternatively, the grid module 1912 may be configured to be automatically activated when the CAD software module 1902 is active. The grid module 1912 generates a geometric grid based on the one or more of the standardized structural panel walls 1906, wherein the grid identifies the coordinates for each of the standardized structural panel walls 1906. In one alternative implementation, the geometric grid generated buy the grid module 1912 exists in each of x, y, and z planes. Yet alternatively, the geometric grid may be set up as a network of multiple grids at various angles to account for the angles typical in building designs. The geometric grid also allows the activation of several grids at various angles to one another to allow for the design of angled buildings, where active grids snap the standardized structural components to precise grid coordinates.

Subsequently, the grid module 1912 automatically positions one or more of the standardized structural panel walls 1906 along grid lines such that the standardized structural panel walls 1906 end substantially close to the grid line intersections. In this manner, the locations and lengths of the standardized structural panel walls 1906 are aligned to the lines of the geometric grid.

Subsequently, the system 1900 employs a mapping solutions module 1914 that analyzes the wall lines as mapped to the geometric grid using structural performance and other data associated with standardized structural components 1910 to determine the position, direction, etc., of the standardized structural components 1910 along the grid lines. In one implementation, the standardized structural components 1910 are mapped to the grid coordinates at predetermined distance intervals. For example, the standardized structural components 1910 are mapped to the grid at interval of two feet. The selection of the predetermined distance interval may be based on a minimum denominator size of the standardized structural components 1910.

The mapping solution module 1914 may first map the standardized structural components 1910 used at part of the floor structure, such as trusses, along the grid lines. Example of such trusses used as part of the floor structure include truss 106 disclosed in FIG. 5 and discussed above. Once the mapping solution module 1914 has established the location and direction of trusses, the mapping solution module 1914 determines location and selection of standardized structural components 1910 that are used as wall panels. Examples of such wall panels include the V-braced horizontal truss panel 20 disclosed in FIG. 3, the open horizontal truss panel 24 disclosed in FIG. 4, etc. The mapping solutions module 1914 calculates an efficient layout of such wall panels by analyzing the location of openings in the walls, column elements such as the structural column 130, etc. For example, the mapping solution module 1914 analyzes the load bearing capacity, the shear capacity, etc., of the structural columns together with such performance capacities of various wall panels to ensure that the resulting structure accommodates the design for wall openings, etc., and also meets construction code. Specifically, the mapping module 1912 may determine the selection of wall panels to maximize efficiency, to minimize cost, etc.

In one implementation, the system 1900 is also configured to change the selection and layout of the standardized structural components 1910 based on one or more changes to the architectural drawing of the building. For example, if a window opening is moved from one wall to another wall or from one location in a wall to another location, the selection and placement of the trusses, wall truss panels, etc., are also changed. Yet alternatively, the system 1900 also allows an engineer to make localized changes to the structure and flows the effect of such changes to the remainder of the building. For example, if the seismic code in a particular jurisdiction requires a particular configuration of panels along a wall line of a building, an engineer is able to make the required change. In such as case, the system 130 automatically analyzes the remaining structure to ensure the compliance of the entire building with codes, structural soundness, etc.

The system 1900 also includes an output module 1916 that allows a user to generate various outputs 1920 based on the results generated by the mapping solutions module 1914. While, system 190 illustrates the output module 1916 as a separate module, in an alternative implementation, such an output module 1916 may be part of system setup. For example, a user may select one or more of the outputs and/or functionalities at the time of setting up the system and the output module 1914 generates the necessary output. For the system 1900 illustrated in FIG. 1, the output module 1916 generates outputs 1922-1934.

Specifically, the output module 1916 is configured to generate a structural component list 1922 including unique identification for each of various structural components for the each of the various walls in the building. Thus, for example, the structural component list 1922 may include a listing of fastening screws, bolts, studs, etc., required for the building structure. In one implementation, the output module 1916 also generates quick response (QR) codes for the various structural components. Such QR codes may be used to uniquely identify a particular structural component or a particular type of structural component. For example, a QR code is provided for uniquely identifying a particular unification plate that is used to attach a structural panel to a horizontal truss panel. Yet alternatively, each of the QR codes 1924 is associated with other information identifying the structural component, such as the location of the structural component in the building structure, the price of the structural component, structural characteristics of the structural component, etc.

The output module 1916 may also be configured to generate structural panel names 1926 for various structural components of the building structure. For example, each particular column of the building structure is assigned a structural panel name that identifies that particular column and provide various information about the column, such as the column thickness, column size, height, column face configuration, etc. Similarly, a structural panel name may identify a particular panel, the panel type, panel distance from corners on various axes, column offset from an end, etc. Further discussion of structural panel names is provided below in FIG. 22.

Furthermore, the output module 1916 may also be configured to generate pages 192 providing information about various structural components of a building structure. Such pages 1928 may be configured as web pages with URLs that may be activated via a QE code. For example, when a user scans one of the QR codes 1924 using a QR code scanner, the user may be provided the web page containing information about that particular client. Thus, for example, if a QR code is provided on a component that is already installed on a building structure, scanning that QR code in the field allows a user to get further information about that structural component. Additionally, the pages 1928 are also dynamically updated with information, such as the location of the structural component, installation status of the structural component, etc. In one implementation, one or more applications provided on a user device used to scan the QR code can also update the information on the pages 1928.

Furthermore, the output module 1916 may also be configured to generate three-dimensional models 1930 of the building structure. In one implementation, such 3-D models 1930 are also dynamically updated such that as the construction of the building progresses, the 3-D model 1916 is also updated. Furthermore, the 3-D models 1930 may also identify various structural components of the building structure. In one implementation, the output module 1916 also generates output files for project engineering review and approval. For example, such output files may includes detailed three-dimensional drawings of the building structure, various stress analysis reports, data required to be submitted for compliance requirements with various building codes, etc. A user may provide a feedback based on the review and approval output, in which case, the user input is incorporated in generating a different solution for the building structure.

In one implementation, the output module 1916 is also configured to generate a bill of material 1932 using information about various structural components of a building structure. Such bill if material may be in the form of a spreadsheet that can be further processed by users. Alternatively, the bill of material output 1932 may be in the form of a file that can be directly imported by an accounting or other financial software for further processing. Yet alternatively, the output module 1916 may also generate purchase orders for the parts that are outsourced. Again, such purchase order output may be in the form that can be further processed by an accounting or financial software.

Yet alternatively, the output module 1916 also generates machine control files 1934 or macro files that can be used to control various machines used to manufacture structural components and standardized structural components. For example, the macro files 1934 generated by the output module 1916 may be used to control various light gauge roll-forming machines that produce track and stud elements for the building structure. Such macro files may be loaded into the manufacturing machines manually or automatically. Additionally, such macro files may also include instructions to the manufacturing machines to generate labels for manufactured parts and standardized structural components. Further discussion of the use of the macro files is provided below in FIG. 24. The output module 1916 also generates shop drawings and specifications 1936 that can be used by the project design team, engineers, and building department. For example, a building inspector may use the shop drawings generated by the output module 1916 to provide approval for a building design, etc.

FIG. 20 illustrates an alternative example block diagram of a system for using the standardized structural components. Specifically, FIG. 20 illustrates a software module 2002 that can be used to interact with existing architectural design software and various interactions with and inputs/outputs to and from the software module 2002. The software module 2002 includes various components or modules 2004-2014 that provide various functionalities for using standardized structural components. The software module 2002 may be installed as a plug-in in any off-the-shelf architectural design software, computer-aided-design (CAD) software, etc. Alternatively, the software module 2002 may be stand-alone software that communicates with architectural design software using one or more application programming interfaces (APIs). For example, the software module 2002 may be configured to be installed and operated on a remote server and various CAD software instances may make API calls to communicate with the software module 2002.

In the implementation illustrated in FIG. 20, architectural software 2020 communicates with the software module 2002 with a building plan and floor plan layout. The building plan and floor plan layout may be in a standard format such as DWG file, DXF file, etc. The software module 2002 includes a wall-positioning module 2004 that assigns floor levels and heights to each of the walls from the architectural design. Specifically, the wall-positioning module 2004 generates a geometric grid based on the architectural diagram and maps various walls from the architectural diagram to the geometric grid. For example, if the architectural diagram includes a room that is 10'×9.5', the wall-positioning module 2004 generates a geometric grid of 10×10 or 10×8 depending on the architects final determination and maps the walls of the room to the grid.

The software module 2002 also includes a floor direction module 2006 that determines the direction of the floors. Specifically, floor structure in a building may be determined by an engineer of record based on loading (live or dead load), where floor loads are carried from wall to wall by the trusses. Sometimes it may be clear as to which direction to place the floor, for example in the north-south (N-S) direction, in the east-west (E-W) direction, etc., for carrying the least load and therefore to use less (reduced cost) structure. The system disclosed herein automatically determines the direction of least loading and places the floor in one of the E-W, N-S, or other direction. Where possible the floor is not loaded against exterior walls as well, automatically. FIG. 2 An opening analysis module 2008 analyzes the openings in the walls that are fit along the geometric grid. For example, the opening analysis module 2008 may analyze doors, windows, pass-throughs, etc., in a particular wall to determine the positioning of various standardized structural components that would be included in that particular wall.

Once the wall size, the floor directions, the openings, and other characteristics of a wall are determined, a standardized structural panel-fitting module 2010 determines the standardized structural components that are to be used for that particular wall. Thus, for example, the fitting module 2010 may determine that two V-based horizontal truss panels, such as those disclosed in FIG. 3, together with an open horizontal truss panel, such as those disclosed in FIGS. 4, 4.1, 4.2 may be used in a given wall. The fitting module 2010 may use a standardized structural panel database 2012 that stores data structures about each of various standardized structural components. For example, each data structure in such database 2012 may provide information about the dimensions, weight, stress capacities, adjoining panels, etc., of a standardized structural panel. The module 2010 selects which standardized structural panel fits a particular module based on length of the wall. In one implementation, the fitting module 2010 analyzes each of the walls in 2' increments to see what standardized structural components are best fits for that particular wall. However, in an alternative implementation, other size of increments may also be used.

The fitting module 2010 also determines where to add structural columns along the grid lines of the geometric grid. In determining the structural columns, the fitting module 2010 analyzes the required load bearing capacity and other characteristics of the building. Once the fitting module 2010 has fit various standardized structural components and structural columns to the grid lines, various output data is generated based on the solution. For example, a manufacturing data generation module 2014 generates data about structural components that are to be outsourced and the specification thereof, data about structural components to be manufactured, macro files for each of the structural component to be manufactured, etc. Such macro files may be used by production machines 2030 to generate the final manufactured components. For example, a macro file may be generated for a cold roll former interface 2032 that instructs a cold roll former machine where to punch holes, where to cut the edges for cold rolled panels, etc. Similarly, other macro files may be used by a welder interface 2034 that can be used by a robotic welder to determine where to generate a welding joint and what kind of welding joint is appropriate. Such macro files allows automation of the process of manufacturing and putting together components used in a building construction 2026.

The software module 2002 generates detailed three-dimensional drawings with specifications, such as stress bearing capacities of each wall (as a combination of standardized structural components and structural columns), noise mitigation specifications, etc. Such drawings with specifications may be submitted to a review and approval processor 2022, such as a local building approval board, an engineer, etc., for further review, the processor may approve the drawings or recommend changes via the architectural software 2020, in which case, the software module 2002 generates a new set of drawings with specifications for revised approval.

Once the designs are approved by the review and approval processor 2022, the architectural software uses the input from the software module 2002 to generate plans and specifications 2024 for the building construction engineers. Such plans and specifications 2024 may include, for example, the schedule specifying the order in which the building construction is to proceed, instructions about how specific components are to be installed, etc., for the actual building construction 2026.

FIG. 21 illustrates an example flowchart 2100 of a method of using the standardized structural components. An operation 2102 receives architectural drawings. For example, a software module plugged in design software may receive such architectural drawings from the design software. After determining the floor dimensions, an operation 2104 generates a geometric grid based on the architectural design. In one implementation, the geometric grid has granularity of 2'×2'. However, in an alternative implementation, geometric grid with other granularity may also be used. Specifically, the geometric grid includes various grid lines and their intersections. Subsequently, an operation 2106 determines the floor dimensions and directions from the received architectural design. In one implementation, if the architectural design has multiple rooms, the operation 2106 may analyze each room at a time and determine the floor dimensions and directions of each room separately. Alternatively, the operation 2106 may determine the floor dimensions and directions of all the rooms in a combined manner.

An operation 2108 positions various walls from the architectural design onto the grid lines. Specifically, only those walls that fit the geometric grid lines to their intersections are positioned along the grid lines. Thus, for example, if a wall was curved wall or its dimension was less than 2', such a wall may not be positioned along a grid line. In such an example, if the architect wants to use a curved or an angled wall, or other walls that are not in 2' increments, such curved walls, etc., are determined to be non-standardized walls. In this case, such walls do not map or reside on the grid lines. Specifically, non-load bearing walls also may not map to the grid lines. An example, of such fitting the architectural walls to the grid lines is provided in further detail below in FIG. 25.

Subsequently, an operation 2110 positions standardized components along the walls that are positioned along the grid lines. Specifically, given that grid lines have a granularity of 2'×2', standardized components fit this walls without requiring any custom manufactured components. Thus, for example, if a 6' wall was positioned along a grid line, a horizontal panel of 4' and another horizontal panel of 2' may be used to create the 6' wall. Furthermore, another operation 2110 analyzes the location of windows and other openings in the walls to determine if open horizontal panels, such as those disclosed in FIGS. 4, 4.1, and 4.2 are required. The selection of the standardized structural components also takes into account the fact that various structural columns are to be added to the structure. Specifically, an operation 2114 adds selects and adds such structural components to the structure. An example of such as structural panel is one disclosed in FIG. 6 above.

Once all the structural components, such as standardized panels, trusses, and columns, are mapped to the architectural design walls, an operation 2116 analyzes the mapped solution. In one implementation, the solution is analyzed with respect to compliance of the resulting structure with various codes, its load bearing capacity, etc. The analyzing operation 2116 may generate output reports including warnings, violations, etc., that will be used by inspectors, engineers, etc., to recommend change to the resulting structure, if necessary. Furthermore, an operation 2118 generates various outputs that can be used in automating the manufacturing and construction of the building structure. If there are any changes necessary, one or more operations of the flowchart 2100 may be repeated as necessary.

FIG. 22 illustrates example of structural panel names generated by the system disclosed herein. Specifically, FIG. 22 illustrates an example of a structural panel name 2210 using panel name abbreviations and a structural column name 2240 using various column name abbreviations. In the example structural panel name 2210, PA represents the type of panel, 312 represents the system size (3.5" or 5.5") of the panel and length of the panel. For example, 3 in 312 denotes that 3.5" system size and 12 represents the length of the panel being 12' (the panel length is in increments of 2'). The number 4032 represents the height of the panel in $\frac{1}{32}$" increments, Sxxx represents the offset of a first stud on the panel from a center line (CL) of a column or from a grid line, Xxxx represents the distance of the panel to a corner on an x-axis, Yxxx represents the distance of the panel to a corner on a y-axis, Wxxx represents a width of an opening, Hxxx represents a height of an opening, and Exxx represents an offset from CL at the end.

In the example structural column name 2240, CB represents column thickness, 3XX represents column size, 4032 represents height of the column in $\frac{1}{32}$" increments, AOJO represents the face configuration of the column, 3033 represents a size of a connected panel to the column, the first A3030 represents the type of an end plate attached to the top of the column, and the second A3030 represents the type of an end plate attached to the bottom of the column.

FIG. 23 illustrates example flowchart 2300 of a method for using specialized code to track building construction progress. Specifically, the flowchart 2300 discloses one or more operations that are taken by the system for using quick response (QR) codes to track building construction. An operation 2302 generates the QR codes. The QR codes are generated such that various standardized structural components, such as panels, columns, trusses, etc., can be uniquely identified by a given QR code. Alternatively, a QR code may be used to identify a plurality of components that are similar to each other. Thus, for example, all unification plates 154 may be identified by a similar QR code. As another example, the QR code for a panel may be attached with a field containing the structural panel name 2210 that provides information about that particular panel.

Subsequently, an operation 2304 attaches information related to a structural component to the QR code. Thus, for example, in a database each of the QR code may be attached to one or more fields that provide information about the structural component that is related to that QR code. Such structural component information may include the dimensions of the structural component, the location of the structural component in a building structure, cost information of that structural component, etc. Subsequently, the QR code is physically attached to the structural component. Thus, for example, a QR code for a truss is printed and attached to that particular truss after it is manufactured.

Once a structural component is provided with a QR code, a determining operation 2308 determines if that QR code has been scanned. For example, a specialized QR code-scanning device, a generic QR code-scanning device such as a smartphone, etc., may be used to scan the QR code. If the QR code has been scanned, control is transferred to another determining operation 2310 that determines if there are any changes to the information related to the structural component. For example, a QR code-scanning device may be provided with a capability to update the status of the structural component in the building construction process, to update the location of the structural component in the building, etc. If the determining operation 2310 determines that such update of information is received, an updating operation 2312 updates the structural component information. Such updating may involve, for example, updating of various fields in a database that are related to the particular structural component. As an example, a scanning device may scan a QR code on a truss that is already installed on the building structure and update the status of that truss to "installed." In this manner, the system disclosed herein provides automatic tracking and updating of deployment of various structural components, including the standardized structural components used in a building construction.

FIG. 24 illustrates an example flowchart 2400 of a method for using machine control filed or macro files to control the manufacturing of the standardized structural components. An operation 2402 generates the macro files. In one implementation, such macro files is generated based on the dimensions of the component that is to be manufactured. For example, for manufacturing a chord of a truss, the length of the chord, the width of the chord, the location of pilot holes and weld slots in the chord, etc., is included in the macro file. An operation 2404 loads the macro file in a machine used to generate the structural component. For example, if the macro file is for generating a chord of a truss, the macro file is loaded in the controlling module of a light gauge roll machine.

In this example, at operation 2406 the light gauge roll machine generates the cold rolled truss chord and cuts it at appropriate length, angle, etc. In one implementation, the macro file is also provided information about the QR code that is to be assigned to the manufactured part. In such an implementation, an operation 2408 generates a QR code that is to be used to label the manufactured truss chord. Furthermore, an operation 2410 also communicates the specification for component to a welding machine that is used to generate the assembled component, such as a truss that uses the cold rolled truss to be combined with various cold rolled braces, etc. The welding machine may use the component specification to automatically generate the welding joints between the various truss components.

Additionally, an operation 2412 generates a list of parts for which the manufacturing in outsourced. Specifically, operation 2412 may also generate a purchase order with the detailed specification about the part. As an example, specification for the unification plates 154 maybe generated by the operation 2412 and sent to an outside manufacturer in the form of a purchase order. In one implementation of the system disclosed herein, an operation 2414 assembles standardized structural components such as columns, trusses, panels, etc., using one or more components that are manufactured and/or outsourced. For example, an automatic assembly machine may be provided a macro file with instructions for assembling the component parts to generate the standardized structural component. Additionally, once the standardized structural component is assembled, a labeling operation 2416 labels it with a QR code or other identification code. For example, each of the trusses may be labeled with a QR code that uniquely identifies that truss. Alternatively, all trusses of the same type are labeled with the same QR code. Subsequently, at an operation 2418 the standardized structural components are used to erect the building structure.

FIG. 25 illustrates an example geometric grid 2500 used by the method and system disclosed herein. Specifically, the geometric grid 2500 is an active grid where various standardized structural components can be mapped (or "snapped") to the precise grid coordinates of the geometric grid 250. For example, the geometric the grid 2500 includes horizontal and vertical grid lines 2502. In one implementation, the grid lines are provided in increments of two feet. However, in alternative implementation, other incremental dimension may be provided. An architect using the system disclosed herein can draw one or more structural walls of a building structure to the grid lines 2502. Thus, for example, structural walls 2504 that are mapped or snapped to one of the geometric grid lines 2502. If there are any walls or other elements of the building that do not fit to the geometric grid lines 2502, they are not mapped to the grid lines. For example, in the illustrated implementation, divider walls 2506, doors, etc., are not snapped or mapped to the geometric grid lines 2502.

FIG. 26 illustrates an example plan view 2600 of a geometric grid with various standardized structural components along the grid lines. Specifically, the plan view 2600 illustrates a number of grid lines 2602 and various standardized structural components 2604, 2606, etc., along the grid lines 2602. As discussed above, each of the standardized structural components 2604, 2606 may be associated with a QR code and saved in a database that includes other information about such standardized structural components 2604, 2606.

FIG. 27 illustrates an example elevation view 2700 of a building structure using various standardized structural components. For example, the elevation view 2700 illustrates various standardized structural components including standardized trusses 2702, standardized panels 2704, standardized columns 2706, etc. FIG. 28 illustrates a three-dimensional view 2800 of a structure generated using various standardized structural components. For example, the three-dimensional view 2800 illustrates various standardized trusses 2802, standardized panels 2804, standardized columns 2806, etc.

FIG. 29 illustrates an example computing system that can be used to implement one or more components of the method and system described herein. A general-purpose computer system 1000 is capable of executing a computer program product to execute a computer process. Data and program files may be input to the computer system 1000, which reads the files and executes the programs therein. Some of the elements of a general-purpose computer system 1000 are shown in FIG. 10, wherein a processor 1002 is shown having an input/output (I/O) section 1004, a Central Processing Unit (CPU) 1006, and a memory section 1008. There may be one or more processors 1002, such that the processor 1002 of the computer system 1000 comprises a single central-processing unit 1006, or a plurality of processing units, commonly referred to as a parallel processing environment. The computer system 1000 may be a conventional computer, a distributed computer, or any other type of computer such as one or more external computers made available via a cloud computing architecture. The described technology is optionally implemented in software devices loaded in memory 1008, stored on a configured DVD/CD-ROM 1010 or storage unit 1012, and/or communicated via a wired or wireless network link 1014 on a carrier signal, thereby transforming the computer system 1000 in FIG. 10 to a special purpose machine for implementing the described operations.

The I/O section 1004 is connected to one or more user-interface devices (e.g., a keyboard 1016 and a display unit 1018), a disk storage unit 1012, and a disk drive unit 1020. Generally, in contemporary systems, the disk drive unit 1020 is a DVD/CD-ROM drive unit capable of reading the DVD/CD-ROM medium 1010, which typically contains programs and data 1022. Computer program products containing mechanisms to effectuate the systems and methods in accordance with the described technology may reside in the memory section 1004, on a disk storage unit 1012, or on the DVD/CD-ROM medium 1010 of such a system 1000, or external storage devices made available via a cloud computing architecture with such computer program products including one or more database management products, web server products, application server products and/or other additional software components. Alternatively, a disk drive unit 1020 may be replaced or supplemented by a floppy drive unit, a tape drive unit, ord other storage medium drive unit. The network adapter 1024 is capable of connecting the computer system to a network via the network link 1014, through which the computer system can receive instructions and data embodied in a carrier wave. Examples of such systems include Intel and PowerPC systems offered by Apple Computer, Inc., personal computers offered by Dell Corporation and by other manufacturers of Intel-compatible personal computers, AMD-based computing systems and other systems running a Windows-based, UNIX-based, or other operating system. It should be understood that computing systems may also embody devices such as Personal Digital Assistants (PDAs), mobile phones, smart-phones, gaming consoles, set top boxes, tablets or slates (e.g., iPads), etc.

When used in a LAN-networking environment, the computer system 1000 is connected (by wired connection or wirelessly) to a local network through the network interface or adapter 1024, which is one type of communications device. When used in a WAN-networking environment, the computer system 1000 typically includes a modem, a network adapter, or any other type of communications device for establishing communications over the wide area network. In a networked environment, program modules depicted relative to the computer system 1000 or portions thereof, may be stored in a remote memory storage device. It is appreciated that the network connections shown are exemplary and other means of and communications devices for establishing a communications link between the computers may be used.

Further, the plurality of internal and external databases, data stores, source database, and/or data cache on the cloud server are stored as memory 1008 or other storage systems, such as disk storage unit 1012 or DVD/CD-ROM medium 1010 and/or other external storage device made available and accessed via a cloud computing architecture. Still further, some or all of the operations for the system disclosed herein may be performed by the processor 1002. In addition, one or more functionalities of the system disclosed herein may be generated by the processor 1002 and a user may interact with these GUIs using one or more user-interface devices (e.g., a keyboard 1016 and a display unit 1018) with some of the data in use directly coming from third party websites and other online sources and data stores via methods including but not limited to web services calls and interfaces without explicit user input.

A server hosts the system for using the standardized structural components disclosed herein. In an alternate implementation, the server also hosts a website or an application that users visit to access the system for using the standardized structural components. Server may be one single server, or a plurality of servers with each such server being a physical server or a virtual machine or a collection of both physical servers and virtual machines. Alternatively, a cloud hosts one or more components of the system for using the standardized structural components. The user devices, the server, the cloud, as well as other resources connected to the communications network access one or more of servers for getting access to one or more websites, applications, web service interfaces, etc., that are used in the system for using the standardized structural components. In one implementation, the server also hosts a search engine that is used by the system for accessing the system for using the standardized structural components and to select one or more services used in the system for using the standardized structural components.

FIG. 30 illustrates an example flowchart 3000 for using an integrated construction portal disclosed herein. Specifically, the flowchart 3000 illustrates various operations for using the integrated construction portal to generate pricing quotes for building construction. An operation 3002 receives an architectural design. For example, the architectural design may be received from software in the form of a CSV file or in other formats that may be read by a computer processor. In one implementation, such architectural design in imported using a menu from a GUI provided by the integrated construction portal. Subsequently, an operation 3104 generates a three-dimensional grid based on the architectural design. The three-dimensional grid may include various structural components, such as a standardized panel, a standardized column, a standardized truss, etc. In one implementation, the three-dimensional grid is an active grid where one or more of the structural components displayed in the grid can be selected to get various specifications for such structural components. Furthermore, each of the structural components is also associated with a three-dimensional position of such a structural component. Thus, for example, a standardized panel in the three-dimensional grid is associated with the horizontal distances (in both x and y directions) as well as the vertical distance (in z direction) from a reference point in the grid. In one implementation, each floor may be provided a reference point. However, in an alternative implementation, the grid may have one reference point that is used to provide references for each structural component in the three-dimensional grid.

A displaying operation 3006 displays the three-dimensional grid to a user. For example, the displaying operation 3006 displays the grid using a GUI application on a computer screen. In one implementation, the GUI application may also be available remotely via the Internet or other network. The GUI application may access data about the three-dimensional grid from a local server, from a cloud server, from a dedicated remote server, etc.

Subsequently, an operation 3008 provides access to the three-dimensional grid one or more vendors, contractors, suppliers, purchasers, etc. In one implementation, the displaying operation 3006 displays different amount of information to a user based on the access level authorization of the user. Thus, for example, an architecture working with the integrated construction portal may have all access to view the three-dimensional grid, including making changes to the three-dimensional grid. On the other hand, a contractor working on the roofing may have access to only the floors in the three-dimensional grid that require roofing. Similarly, a door provider will only have access to sections of the grid that require door, etc. Yet alternatively, access to the grid may also be provided based on other criteria, such as customer of a section of the building, etc. For example, if a client is purchasing the second floor of the building and the client is interested in getting its own contractors for work on the second floor, the client may be provided access to the second floor of the grid for various evaluation purposes, pricing purposes, etc.

Subsequently, an operation 3010 receives information from the vendor, supplier, etc., about placement of one or more additional components to the three-dimensional grid. For example, such an additional component may be a non-structural component to be supplied by a given vendor that is given access to the three-dimensional grid. The vendor may select the placement of such component using a drop down menu, a drag and drop menu, etc. For example, a roofing supplier may select a particular roofing option from a drop-down menu, select a section of the roof on the three-dimensional grid, and place the selected roofing option at the selected location.

An evaluation operation 3012 evaluates if the component is compatible with the building requirements, specifications, codes, etc. For example, if a roofing vendor associates a roofing component that is so heavy that it would not work with the building, or that it is not in compliance with the local building codes, regulations, etc., the flowchart provides appropriate message to the supplier and request to submit at revised roofing component.

A revising operation 3014 revises the three-dimensional grid using the newly added component by the vendor. Thus, upon receiving the information about the roofing component and its placement, the roofing component may be attached to the location and various specifications of the selected roofing component may be associated with the various structural components that are located related to the selected roofing location. For example, if a particular standardized column with a given load bearing capacity were associated with the selected location for the roofing component, the weight of the roof, as it will be borne by the particular standardized column is associated to that particular standardized column. Similarly, if the vendor for a window selects and places a window to a particular three-dimensional location, the specification for that window would be associated with the panels that are attached to that particular window.

Subsequently, a receiving operation 3016 receives the pricing information from the vendor, supplier, etc. For example, a supplier of HVAC equipment that has associated one or more HVAC equipment with the three-dimensional grid may also associate the pricing information about the HVAC equipment in a file with the HVAC equipment specification so that the three-dimensional grid extracts such pricing information from the file. In one implementation, when a vendor selects a component to be attached using a drop down menu, the GUI selects the entire file about that component, including the specifications, the pricing, etc. As a result, when the vendor associates that component to the three-dimensional grid, all the specifications of that component together with the pricing is also associated with the three-dimensional grid.

Subsequently, an operation 3018 generates a revised pricing estimate for the building, taking into consideration the pricing for all structural components, all non-structural components, etc. A communicating operation 3020 may communicate the revised pricing information to an architect, a developer, etc. If an operation 3022 determines that one or more changes are made to the three-dimensional grid or that any other components are added thereto, one or more of the operations of the flowchart 3000 are initiated.

The operations disclosed in FIG. 30 allows a building architect or developer to collaborate with multiple parties to design or redesign a building, to get pricing estimates for various iterations of building designs, etc. For example, using the operations disclosed in FIG. 30, a builder may invite a number of vendors to provide bids for pricing various components, evaluate whether a component supplied by a vendor will work with the structural components of the buildings, etc. After receiving the bid, the specification, the pricing, etc., the builder may generate a revised pricing estimate and compare that to other pricing estimates. Such iterative process allows a builder to make informed decisions about the building in a dynamic and more cost effective manner.

FIG. 31 illustrates an example block diagram 3100 of an integrated construction portal disclosed herein. Specifically, FIG. 31 illustrates a user interface 3102 that is provided by an integrated construction portal disclosed herein. The user interface 3102 may be accessed by a computer, a mobile device, etc., connected to a network, such as the Internet, a VPN, etc. the integrated construction portal generates the user interface 3102 based on a design file 3106 provided by a design software module, such as a CAD design software, etc. Furthermore, a database 3108 providing specifications 3110 for one or more structural components, such as panels, columns, trusses, etc., is also used in generating the user interface 3102.

The user interface 3102 includes a display window 3110 illustrating a three-dimensional grid 3112 of a building. In one implementation, the user interface 3102 allows a user to select the three-dimensional grid 3112 and view it from different angles. Yet alternatively, the user is able to zoom into specific parts of the building and review the details of various structural components of the building. For example, a user can select a wall on the second floor of the building and review the associated specifications regarding various panels, trusses, etc., used in that particular wall.

The user display 3102 also includes a drop down menu 3114 that can be used for various functions. For example, a user can select one of the options from the drop-down menu 3114 to activate a menu of options 3116. Thus, a roofing contractor may select an option from the drop down menu 3114 to activate the menu of options 3116. Furthermore, the contractor can select one of the options from the menu of options 3116 to select a roofing component 3118 that can be positioned on the three-dimensional grid 3112. In response to such a positioning of the roofing component 3118, various specifications, pricing, etc., of the roofing component 3118 are associated with the particular location on the three-dimensional grid 3112. Once the compatibility of the roofing component 3112 is verified, the integrated construction portal updates various specifications, pricing, etc., of the three-dimensional grid 3112. As illustrated in FIG. 31, users such as a contractor and/or a subcontractor 3122, a manufacturer 3124, a supplier 3126, a vendor 3128, etc., may use the user display 3102 to participate in an interactive and dynamic manner.

FIG. 32 illustrates an alternative example block diagram of the integrated construction portal 3200 disclosed herein. Specifically, the integrated construction portal 3200 includes information about a three-dimensional grid 3202 is a cloud 3204. Alternatively, the information about a three-dimensional grid 3202 may also be stored on a dedicated local server, a remote server, etc. The information about the three-dimensional grid 3202 may include information including specification for various components, pricing of various components, etc. The three-dimensional grid 3202 may be generated based on an architectural model 3206 provided by an architect, etc.

In one implementation, an administrator of the integrated construction portal 3200 gives access to the three-dimensional grid 3202 to a contractor A 3214. For example, if the contractor A is a contractor for HVAC, the access provided to the contractor A is limited to the viewing of components of the three-dimensional grid 3202 that are useful in determining the placement of the HVAC equipment. The contractor A 3214 may provide specification 3216 for the HVAC equipment, the pricing 3218 for the HVAC equipment, the installation scheduling 3220 for the HVAC equipment, etc., to the integrated construction portal 3200. For example, the contractor A 3214 may provide such information to the integrated construction portal 3200 using a drop down menu or other menu options from a user display. A number of other users, such as a manufacturer 3230, a vendor 3232, a subcontractor 3234, a supplier 3236, engineers 3240, a general contractor 3242, etc., may also interact with the three-dimensional grid 3202 in a dynamic manner.

In an alternative implementation, the integrated portal system disclosed herein provides generating a three-dimensional construction grid based on a data file generated by an architectural software, wherein the three-dimensional grid includes three-dimensional position information of various structural building components; displaying the three-dimensional construction grid using a display device of a computing device; receiving information of various non-structural building components, the information including location of the non-structural building components on the three-dimensional grid; associating the non-structural building components to one or more of the structural components of the three-dimensional grid; and automatically generating a plurality of specifications for the non-structural building components.

Alternatively, the integrated system disclosed herein provides selecting one of the non-structural building components from a menu; and receiving instruction for placement of the selected non-structural building component on the three-dimensional grid. Yet alternatively, the integrated system disclosed herein generates a revised three-dimensional construction grid including the non-structural building components. In one implementation, the non-structural building components includes at least one of (1) a door component, (2) a window component, (3) an HVAC component, (4) a plumbing component, (5) an electrical component, (6) an interior non-structural wall, (7) an exterior finishing component, (8) a flooring component, (9) a roofing component, (10) a fixture, etc. The specifications for such non-structural components may include, for example, weight of the component, location of the component, size of the component, material type of the component, the thermal capacity of the component, etc.

An implementation of the method further comprises providing access to the three-dimensional construction grid to vendors of the non-structural building components, wherein receiving the information of the non-structural building components further comprises receiving the information of the non-structural building components from the vendors. Yet alternatively, the integrated portal system further comprises generating pricing information of the various structural building components; generating a first pricing estimate for a building based on the three-dimensional construction grid and the pricing information of the various structural building components; receiving pricing information of the non-structural building components from the vendors; and generating a second pricing estimate based on the first pricing estimate and the pricing information of the non-structural building components from the vendors. Yet alternatively, the method disclosed herein further comprises receiving the data file generated by an architectural software from an architect; and communicating the second pricing estimate to the architect.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications, which are within the scope of the appended claims, is reserved.

What is claimed is:

1. A method comprising:
   generating a three-dimensional construction grid based on a data file generated by an architectural software, wherein the three-dimensional grid includes three-dimensional position information of various structural building components;
   receiving information of various non-structural building components, the information including location of the non-structural building components on the three-dimensional grid;
   associating the non-structural building components to one or more of the structural components of the three-dimensional grid;
   evaluating if the non-structural building components are compatible with building requirements, specifications, and codes; and
   automatically populating a plurality of specifications for the non-structural building components at a URL associated with a QR code associated with the one of the various structural building components.

2. The method of claim 1, further comprising:
   scanning the QR code associated with one of the plurality of structural components;
   receiving from a user an input associated with one of the plurality of structural components; and
   updating information associated with a URL associated with the scanned QR code.

3. The method of claim 1, further comprising revising the three-dimensional grid based on the information of various non-structural building components.

4. The method of claim 3, wherein revising the three-dimensional grid includes associating a non-structural building component with structural building components that are affected by the non-structural building component.

5. A system, which comprises a processor, computer, or other hardware device, comprising:
   a design module configured to generate a three-dimensional construction grid based on a data file generated by architectural software, wherein the three-dimensional grid includes three-dimensional position information of various structural building components;
   an input module configured to receive information of various non-structural building components on the three-dimensional grid;
   an association module configured to generate a plurality of specifications for the non-structural building components;
   a specification generation module configured to generate a plurality of specifications for the non-structural building components; and
   a QR code scanning device configured to scan a QR code associated with one of the plurality of structural components, receive from a user an input associated with the one of the plurality of structural building components, and update information associated with a URL associated with the scanned QR code.

6. The system of claim 5, wherein the association module is further configured to associate a non-structural building component with any of the plurality of structural building components that are affected by the non-structural building component.

7. The system of claim 5, wherein verifying the compatibility of the non-structural building components with the three-dimensional grid further includes evaluating if the non-structural building components are compatible with building requirements, specifications, and codes.

8. The system of claim 5, wherein the information associated with the URL is an installation status of the one of the plurality of structural building components.

* * * * *